United States Patent [19]
Denenberg et al.

[11] Patent Number: 5,537,551
[45] Date of Patent: Jul. 16, 1996

[54] DATA COMPRESSION METHOD FOR USE IN A COMPUTERIZED INFORMATIONAL AND TRANSACTIONAL NETWORK

[76] Inventors: Jeffrey N. Denenberg, 345 Putting Green Rd., Trumbull, Conn. 06611; Edward D. Weinberger, 370 Central Park West, Apt. 409, New York, N.Y. 10025; Michael L. Gordon, 34 Hickory Hill Dr., Dobbs Ferry, N.Y. 10522

[21] Appl. No.: 978,344

[22] Filed: Nov. 18, 1992

[51] Int. Cl.⁶ .............................. H03M 7/30; H03M 7/48; G06F 15/16
[52] U.S. Cl. ................ 395/200.18; 341/55; 364/DIG. 2; 364/919; 364/DIG. 1; 364/260.6; 364/260.4
[58] Field of Search ......................... 341/55, 67; 380/42; 395/200.18; 382/239, 245, 246

[56] References Cited

U.S. PATENT DOCUMENTS

| | | | |
|---|---|---|---|
| 3,675,211 | 7/1972 | Raviv | 340/172.5 |
| 3,675,212 | 7/1972 | Raviv et al. | 340/172.5 |
| 3,694,813 | 9/1972 | Loh et al. | 341/67 |
| 3,701,108 | 10/1972 | Loh et al. | 341/67 |
| 3,883,847 | 5/1975 | Frank | 340/146.1 R |
| 3,935,379 | 1/1976 | Thornburg et al. | 178/6 |
| 4,099,257 | 7/1978 | Arnold et al. | 374/900 |
| 4,396,906 | 8/1983 | Weaver | 340/347 DD |
| 4,464,650 | 8/1984 | Eastman et al. | 340/347 DD |
| 4,494,108 | 1/1985 | Langdon, Jr. et al. | 340/347 DD |
| 4,626,829 | 12/1986 | Hauh | 341/63 |
| 4,782,325 | 11/1988 | Jeppsson et al. | 341/55 |
| 4,839,649 | 6/1989 | Imal et al. | 341/65 |
| 4,847,619 | 7/1989 | Kato et al. | 341/106 |
| 4,988,998 | 1/1991 | O'Brien | 341/55 |
| 5,109,433 | 4/1992 | Notenboom | 382/40 |

OTHER PUBLICATIONS

Bell et al., *Modeling for Text Compression*, Dec. 1989, ACM Computing Surveys, vol. 21, No. 4, pp. 557–590.

Fila et al., *Data Compression With Finite Windows*, Apr. 1989, Communications Of The ACM, vol. 32, No. 4, pp. 490–505.

Ziv et al., *Compression Of Individual Sequences Via Variable—Rate Coding*, Sep. 1978, IEEE Transactions On Information Theory, vol. IT–24, No. 5, pp. 530–505.

Ziv et al., *A Universal Algorithm For Sequential Data Compression*, May 1977, IEEE Transactions On Information Theory, + vol. IT–23, No. 3, pp. 337–343.

Primary Examiner—Thomas C. Lee
Assistant Examiner—D. Dinh
Attorney, Agent, or Firm—Paul C. Scifo

[57] ABSTRACT

A method for compressing and subsequently decompressing digital data communicated in an interactive computer network, the network designed to provide informational and transactional services to a very large population of users. The method features steps for compressing bytes of network data before transmission by substituting variable-length code words obtained from a fixed, look-up table, and, reconstituting the bytes using a fixed, decompression look-up table when the code words are received at the data reception site. In accordance with the invention, the compression and decompression look-up tables are statistically compiled by sampling the occurrence frequency of byte pairs in the network data stream, and where byte pairs are found to occur above a predetermined frequency, code words having lengths inversely related to the occurrence frequency are created for inclusion in the table so that a code word may be substituted for one byte of a pair when the other byte of the pair is found to precede it during compression, and the byte reconstituted from the code word using the decompression table when the code word is received at the reception site. Additionally, where a byte and its preceding byte constitute a pair not found within the pairs compression table, the method features steps for transmitting the byte compressed in accordance with a context-free encoding scheme, together with a suitable escape code word. Yet further, the method features steps for combining other compression and decompression procedures with the byte-pair compression and decompression to produce a compound compression scheme for the network data stream.

9 Claims, 8 Drawing Sheets

In general, each codeword has a "prefix" and a "field." For the Nth codeword range, the prefix equals 0 plus N 1's, and the field equals "Start" plus N times "Step." When field equals "Stop", the prefix equals N 1's.

For example, where Start = 2; Step = 1; and Stop = 6:

| N | CODEWORD | | RANGE | VALUE |
|---|----------|--------|-------|-------|
|   | Prefix | Field |   |   |
| 0 | 0    | xx     | A | 0 - 3 |
| 1 | 10   | xxx    | B | 4 - 11 |
| 2 | 110  | xxxx   | C | 12 - 27 |
| 3 | 1110 | xxxxx  | D | 28 - 59 |
| 4 | 1111 | xxxxxx | E | 60 - 123 |

DATA COMPRESSION METHOD FOR USE IN A COMPUTERIZED INFORMATIONAL AND TRANSACTIONAL NETWORK

FIELD OF INVENTION

This invention concerns a method for compressing and subsequently decompressing digital data. Particularly, the method features steps for compressing and decompressing bytes of the digital data stream with the use of fixed, look-up tables. In accordance with the invention, the compression and decompression look-up tables are statistically compiled by sampling the byte-pair occurrence frequency within the network, and for byte pairs having a frequency above a predetermined level, ascribing code words of lengths inversely related to the byte-pair frequency of occurrence. Where a byte and its preceding byte constitute a pair not among the pairs having a frequency above the predetermined level, the method features steps for transmitting the byte compressed in accordance with a context-free encoding scheme, together with a suitable escape code word. Yet further, the method includes steps for combining other compression and decompression procedures with the byte-pair compression and decompression to provide a compound compression scheme for the data stream.

BACKGROUND OF THE INVENTION

The explosive growth of data communications and database management has generated a boom in interactive, digital informational and transactional services. With the aid of the public telephone network, their personal computers and modems, literally millions of subscribers can interactively access specialty databases to obtain news, information, entertainment, and shop for goods and services of all types.

The PRODIGY® Interactive Service, available from the Prodigy Services Company of New York is a leading offering in this field. It furnishes a host of informational and transactional features that bring the benefits of the information revolution to contemporary life. From the convenience of their homes and offices, subscribers can obtain headline news concerning current events, business, sports, science, politics, finance and health simply by calling up and selecting corresponding headings displayed at their computer screens. In addition, more in-depth information on these and others subjects can be obtained together with expert commentary and analysis by accessing a variety of departments and categories that even include an electronic encyclopedia containing well over 35,000 articles.

Additionally, subscribers can conveniently shop for a wide variety of goods and services. Subscribers can look over and select such items as clothing, sporting goods, foods, consumer electronics, computers, cars, real estate and others. Further, they can obtain services such as electronic banking, bill paying, loan transactions, stock brokerage, airline ticketing, lodging reservation, car rental, insurance coverage, legal advice, and, education courses from an electronic university. Still further, subscribers can also use the Service recreationally to interactively play games, pursue pastimes such as gardening, cooking, travel and electronically correspond with other subscribers over the Service bulletin boards.

Such a sweeping range of offerings and ease of use have produced broad acceptance of interactive services and, in the case of PRODIGY, generated memberships well in excess of a million and a half in the four years since its public offering in late 1988. Success in providing service utility, however, has stimulated subscriber appetite for even more comprehensive performance. Once having seen how helpful and entertaining such a service can be, subscribers now seek service features containing even more information, enhanced with yet greater amounts of graphics. And, subscribers want these information-enriched features supplied to them with still less wait time between submission of the request at their keyboards and display of the feature at their computer screens.

Regrettably, however, there are constraints on the degree to which service providers can enhance their offerings. Inherent limitations in the public telephone network restrict the amount of information per screen that can be supplied practically to subscribers. More specifically, bandwidth restrictions inherent in the telephone network limit the rate at which digital data can be transmitted using the public phone lines. Accordingly, service providers are limited in the amount of information they can present per screen and still maintain acceptable wait times between screens.

In 1875, when Alexander Graham Bell first conceived his telephone system, the objective, while wondrous for the times, was merely to enable people to talk with one another. To that end, he proposed to convert the sound waves produced by a caller's speech into analogue electrical signals having amplitudes and frequencies corresponding to those sound waves, and to thereafter, transmit the analogue, electrical signals over ordinary circuits to a listener where the signals would be converted back into sound waves that matched the caller's speech. In implementing this system, the circuits of wires, cables and amplifiers developed to connect callers and listeners, i.e., the public telephone network, were provided with only a limited capacity for carrying electrical signals so as to keep costs low enough to allow for mass usage, the anticipated key to success. Specifically, the designers provided the telephone circuits with only enough electrical bandwidth to transmit a portion of the vocal range sufficient to enable parties to the conversation to understand one another. Specifically, public phone lines evolved over time to have an electrical bandwidth of approximately 3,000 Hz, lying between 300 Hz and 3,400 Hz. In the early days, no one foresaw the coming digital communication revolution and its needs.

Digital data signals; i.e., the type of signals required for interactive services, on the other hand, are not suited to transmission over limited bandwidth lines. Because digital signals are composed of pulse trains that inherently contain a much broader range of frequencies, they are subject to substantial distortion when sought to be transmitted over phone lines. The limited bandwidth of the telephone lines cut off the higher frequency and d.c. components of digital pulse trains causing the pulses that make up the trains to smear out and run together with resulting loss of the digital information.

While innovation has enabled ordinary phone lines to carry digital data, still, significant limitation in data throughput remain. In the 1960's, modems (modulator/demodulator) were introduced that permitted digital data to be sent over public telephone lines. In accordance with the design, a modem is connected to the sending and receiving ends of the line. At the sending end, the modem is arranged to accept trains of pulses from the digital equipment; e.g., a computer, the trains of pulses including 1 and 0 bits of the digital data in the presence and absence of the pulses. The modem then successively converts the 1 and 0 bits of the pulse trains into two distinct and corresponding analog electrical signals, one representing the 1 bits and the other representing the 0 bits.

This is done by modulating one or more of the characteristics; i.e., amplitude, frequency, or phase of a first carrier; e.g., 1,200 Hz sine wave. At the receiving end, the other modem detects the two distinct analogue signals resulting from modulation of the first carrier and reproduces digital signals; i.e., trains of pulses identical to the original, and supplies the pulse trains to the digital equipment at the receiving end of the line; e.g., another computer.

In addition, to enable simultaneous, bi-directional data transmission, a second carrier; e.g., 2,400 Hz; is provided for so that two further signals spaced in frequency from the first two can be generated that permit the receiving modem to concurrently transmit 1 and 0 bits of digital information to the sending modem, so called "full-duplex" operation. By manipulating the amplitude, frequency and phase of the first and second carrier signals, a number of distinct states for each can be defined that enable digital data to be bidirectionally transmitted at rates of up to 14,400 bits per second over the phone lines.

But, even at the data transmission rates of 14,400 bits per second, traditional telephone lines are limited in their ability to supply the screen data necessary to sustain an information-enriched interactive service. For example, it takes approximately 2 seconds for a contemporary microcomputer (386/25 IBM-compatible machine) at 14,400 bps to receive and display the screens typical of an interactive service such as PRODIGY. However, these screens are predominantly character based, and contain on the order of only 16K data bits per screen. Where such screens are supplemented with graphics, say for example where half the screen includes 16 color, VGA images, the screen bit count rises dramatically and can include on the order of 600K bits per screen. And, with that increase in data, the time between received screens can rise to over a minute and a half. Further, where the desire is to present full screen VGA color graphics, the time between screens can balloon even more dramatically to almost three and a half minutes, a commercially unacceptable delay. Still further, the increase in required data throughput and associated delay becomes even more pronounced where enhancements of sound and motion are contemplated.

While certain strategies have been developed to reduce the effects of line delay; for example, caching data at the subscriber's computer to avoid the need to transmit data from the service host each time a screen is requested, a technique pioneered by PRODIGY, due to limitations on available local storage and the continuing call for new applications and associated screens by a subscriber, the service still must supply a substantial amount of data over the phone lines to support an interactive session. As a result, the attendant delay associated with conventional phone lines remains an obstacle to providing information-enriched service screens.

In the past, engineers have sought to overcome problems of transmission delay and limited storage associated with the handling of large amounts of digital data. However, the developments resulting from those efforts have not been well suited in their original forms to interactive services. Previously, workers in the digital communication field found that the effects of transmission delay and limited storage could be significantly reduced by compressing the data prior to transmission and storage, and subsequently expanding; i.e., decompressing, the data at the time of use. At an early point, it was found that information streams such as text and graphics tended to be both predictable and repetitive. Further, it was recognized that where the appearance of data strings within the information streams could be statistically predicted, representative code words having lengths dependent on the probability of appearance of the strings but, less in length on average than the original strings, could be created and substituted so as to decrease the amount of data required to be actually transmitted and stored.

Additionally, it was recognized that where strings of data were repetitive, reduced-sized codes could be substituted using specially prepared dictionaries. Typically, the dictionaries included code words of fixed length that were dependent on the number of entries in the dictionary but, less in length than select repetitive strings. Further, in some implementations, the code words were indexed to prior appearing strings so they could be substituted as the strings repeated in the data stream. In this way, the data actually transmitted and stored, again, could be reduced.

Still further, workers found that both approaches could be rendered even more effective, in certain cases, if the respective statistics or dictionaries were adjusted during the compression process to more accurately reflect the composition of the data stream being compressed. This adjustment process or modeling of the data source on the fly has become known as adaptive compression, and is typically found to provide better results than fixed compression; i.e., compression where the encoding statistics or dictionaries are set for the system at some initial time and thereafter not adjusted. As might be expected however, this improvement in performance is not without a price. The complexity associated with adaptive compression invariably requires additional computing resources and storage space be provided to handle the more elaborate algorithms and retain the results. Additionally, adaptive approaches, particularly as implemented in dictionary-type systems are found to be less effective where the data sample size is small; e.g., less that 500 bytes.

Regrettably however, because of constraints in the environment in which interactive services such as PRODIGY must operate, traditional statistical and dictionary compression, whether adaptive or fixed, have not been well suited to solving the problems presented by information-enriched features.

In the case of statistical compression, while source analysis can lead to symbol predictability that provides significant degrees of compression; e.g., compression ratios on the order of 0.5 and better, this approach demands significant computing resources; e.g., CPU and RAM, to systematically inspect the data stream, build frequently statistics and generate the unique abbreviated code words needed for compression. Additionally, significant amounts of disk storage space are required to hold the required program code and analysis results. Still further, time is required to process the compression and decompression algorithms which adversely affect screen presentation performance given the type of equipment commonly used by an interactive service subscriber.

Additionally, while dictionary techniques typically can also provide significant compression and do so even faster and with less demand on CPU and RAM elements, still, they require significant amounts of disk storage space. In the case of dictionary compression, while table look up of code words rather than computation is relied on, thus reducing the CPU and RAM time and requirements, still, to provide meaningful coverage of the symbols in the data stream, significant table size is needed. Accordingly, disk storage space can be significant. Further, dictionary techniques also require some computing resources to manage their algorithms.

Still further, where either statistical or dictionary compression is sought to be made adaptive, yet additional amounts of CPU, RAM and disk storage resources are required, and may even call for use of specialty processing and storage facility in the form of dedicated hardware to implement the method steps. And, where dictionary look up is done adaptively; i.e., where a block of previously transmitted data becomes the dictionary looked to see whether the current data is repeating, as noted, the process becomes less effective as the block size becomes smaller; e.g., on the order of 500 bytes or less, as is typically of interactive services such as PRODIGY.

In view of their resource-intensive character, conventional data compression systems have not been found well suited to interactive service such as PRODIGY. In order to make its features available to as wide an audience as possible, PRODIGY was designed to work with the microcomputer systems commonly found in today's homes and offices. These system include not only the latest in microcomputer technology, but also, substantial numbers of lower-cost, older computer units; e.g., IBM and IBM-compatible units having Intel 8088 and 80286 microprocessors, or comparable Apple systems, that lack the comprehensive computing power and storage resources of state-of-the-art equipment. And, in these older units, the resource demands of conventional statistical or dictionary compression would either not be met or would severely burden system performance. Additionally, because the PRODIGY Service is intended to run on ubiquitous systems at minimal cost, it would be commercially impractical to use specialty add-in boards or other compression hardware that might otherwise prove of value.

SUMMARY OF INVENTION

Accordingly, it is an object of this invention to provide a compression and decompression method for reducing the data transmission and storage requirements of an interactive service network.

It is a further object of this invention to provide a compression and decompression method for reducing the data transmission and storage requirements of an interactive service network without substantially increasing the computing resources required to support the service.

It is a still further object of this invention to provide a data compression and decompression method for use in an interactive service network that is inexpensive to install and operate.

It is a yet further object of this invention to provide a data compression and decompression method that may be readily updated to accommodate changes in the data transmitted and stored in an interactive service.

It is yet a further object of this invention to provide a data compression and decompression method that is wholly software implemented.

And, it is a still further object of this invention to provide a data compression and decompression method for use in an interactive service network that may be integrated with other data compression techniques to provide a compound compression scheme.

Briefly, the data compression method in accordance with this invention achieves the above and other objectives by including steps for determining byte-pair occurrence frequency in the network data stream; building compression and decompression tables that index code words for byte pairs that occur above a predetermined frequency, the code words having lengths dependent on the occurrence frequency of the identified byte pairs; and deploying the tables and companion use procedures; i.e., programs, in the interactive system network so that compression and decompression of the data stream can be undertaken with reference to the respective tables. In accordance with the invention, the method also includes steps for providing the tables with escape sequence code words and context-free byte code words for bytes of pairs that do not occur above the predetermined frequency so that the second bytes of such pairs may be transmitted compressed with code words having lengths dependent on occurrence frequency of the current byte only; i.e., independent of the pair or prior byte occurrence frequency.

In accordance with the invention, the method includes steps for arranging the compression table and its enabling use procedures; i.e., programs, at the interactive network host such that a byte of the network data stream can be compressed by substituting a code word from the compression table when the byte is one of a pair whose companion byte has immediately preceded it, and for which pair a code word has been provided in the decompression table; i.e., a pair having an occurrence frequency above the predetermined level. In this arrangement, the code word is generated using a code selected to provide minimum average code word length in the context of the preceding byte. Further, the method includes steps for deploying the decompression table and companion use procedures at the subscriber reception systems such that a stream of bits received following a known, preceding byte can be recognized as a compression code word. Once the code word is recognized, it is analyzed using the parameters values of the code associated with the preceding byte, to determine the offset into the decompression table where the uncompressed byte can be found.

Additionally, the method, in preferred form, features steps for transmitting data stream bytes compressed in accordance with a context-free encoding, together with an identifying escape code word where the byte to be transmitted is not immediately preceded by a byte that when combined with the byte to be transmitted constitutes a pair for which an compression code word has been provided. Still further, the method includes steps for arranging the decompression table and associated use procedures; i.e., programs, so that a bit stream immediately following a known byte and an escape code sequence can be identified as a context-free encoded byte and decoded. And, the method includes steps for establishing bit and byte position pointers which are associated with the data stream so that byte boundaries can be maintained and identified as the data moves between encoded and decoded form.

Yet additionally, the method features steps for combining run length compression and decompression with the byte-pair and context-free compression and decompression to produce a compound compression scheme for the network that provides a still further degree of compression than provided by the byte-pair and context-free process alone.

In preferred form, the method calls for table pairs to be organized in groups indexed by the pair first bytes, and pair code words generated using start-step-stop, unary codes optimized for each group that are based on the occurrence frequency of the pairs within the respective groups. Further, the escape sequence code word for a particular preceding byte is produced by including the escape sequence in the respective pair group for the particular preceding byte and generating a code word based on the occurrence frequency of the escape sequence relative to the occurrence frequency of the pairs associated with the particular preceding byte.

Still further, the context-free code words are generated using a start-step-stop, unary codes based on the occurrence frequencies of the context-free bytes in the escape sequences.

The method in preferred form also includes steps for organizing the compression and decompression tables in separate, but related formats. A first, reduced size or small table format is used for the decompression table which, as noted, is deployed at the subscriber reception systems to minimize the demand on the subscriber equipment. Additionally, a second, expanded or large table format is created in accordance with the method from the small table data, and is used at the network host where computing resources are readily available to maximize compression speed and efficiency.

In preferred form, the method includes steps for providing the tables with a pluralities of pairs rows, each pairs row being organized for one of the 256 possible first bytes of the pairs the system is capable of generating. In the case of the compression table; i.e., the large table, the 256 second bytes of all possible byte pairs are arranged as columns with respect to the rows to produce a 256×256 byte array. In each of the array's approximate 65K cells, a start-step-stop code word for the pair and length parameter for the code word are provided. For a predetermined number of pairs dependent on the allowable size of the decompression table, (4,096 in preferred form), the compression table cells of the respective rows include pair code words generated using an optimized start-step-stop code; i.e., a code selected to generate the shortest, average code word length for the occurrence frequency of the pairs of the respective row. For the remainder of the pairs included in the compression table (approximately 61K) the compression table includes escape sequence code words based on the occurrence frequency of the sequences in the presence of particular preceding bytes, and context-free code words, the context-free code words being generated with yet an additional optimized start-step-stop code.

As noted, the decompression table; i.e., the small table, also includes a plurality of pairs rows, one for each of the 256 possible first bytes of the pairs the system is capable of generating. In addition to the pairs array formed by the 256 pairs rows, the small table also includes a table information array as a 257th row, the table information array including data concerning the pairs array and the codes used in the table. In accordance with the invention, however, to reduce demand on the storage resources at the subscriber's reception system, the method formulates the rows of the pairs array with only a sufficient number of cells to accommodate the second bytes of a predetermined number of most frequently occurring byte pairs, the most frequently occurring pairs being identified based on a sampling of the data stream. Further, the cells of the decompression table contain the actual second bytes of the respective pairs rather than code words. In accordance with the invention, the information array includes a plurality of elements, each containing data concerning a row of the pairs array, the data including the respective location of the boundaries for pairs rows, the escape sequence code word for the pair first bytes of the respective rows, the parameters for the start-step-stop codes for the respective pairs rows, and the parameters for context-free start-step-stop code.

In the decompression table, the second bytes of the selected pairs are arranged in the respective rows in descending occurrence frequency order, and are each located in the row by a displacement value that is derived from the respective code word itself, the associated value for the code words being based on selection of the code word in the compression table, thereby linking the two tables. Accordingly, the selected pairs are identified in the table with a byte-pair offset, the offset being a byte count from the table beginning that includes a component designating the beginning boundary for the row, and a displacement component designating a byte location within the row. The context-free bytes are indexed in the tables in a comparable fashion, the context-free being located within a row at a byte position identified by the escape sequence code word for the row. The context-free bytes, however, are identified by reference to a context-free offset rather that a byte-pair offset, the context-free offset, again, being a byte count from the table beginning that includes a component designating the beginning boundary for the row, and a displacement component designating a byte location within the row that corresponds to the escape code word value for the row.

In preferred form, the small table pairs array includes a total of approximately 4,352 bytes which designate 4,096 byte pairs and 256 context-free bytes. Additionally, the table information array includes approximately 1025 bytes concerning the 256 pairs row boundaries, the 256 escape sequence code words, 256 start-step-stop codes for the respective pairs rows and the start-step-stop code for the context-free code. Accordingly, the total size of the small table in preferred form is approximately 5,381 bytes.

Still further, in preferred form, the method includes steps for enabling the interactive network to transmit data either compressed or uncompressed depending on the capabilities of the reception system requesting the data. In addition, the method includes steps for permitting the network to compress both the data that supports subscriber interactive screens and subscriber messages. In accordance with the invention, when subscriber sends a request for data to the network host during an interactive session, the subscriber's reception system sets a flag in the request data structure which indicates whether the subscriber's reception system includes a decompression facility capable of handling compressed data. Thereafter, pre-compressed data for supporting the interactive session, is supplied to the subscriber.

In the case of messages transmitted to and from the subscriber, on forwarding a message sequence to the host, the subscriber reception system sets a flag in the message data request structure that indicates whether the subscriber's reception system is capable of handling compressed data or not, and subsequent replies to the subscriber's message activity are provided accordingly.

BRIEF DESCRIPTION OF THE DRAWINGS

The above and other objects, features and advantages of this invention will become apparent upon reading the following detailed description with reference to the accompanying drawings in which.

DETAILED DESCRIPTION

Figure 1:
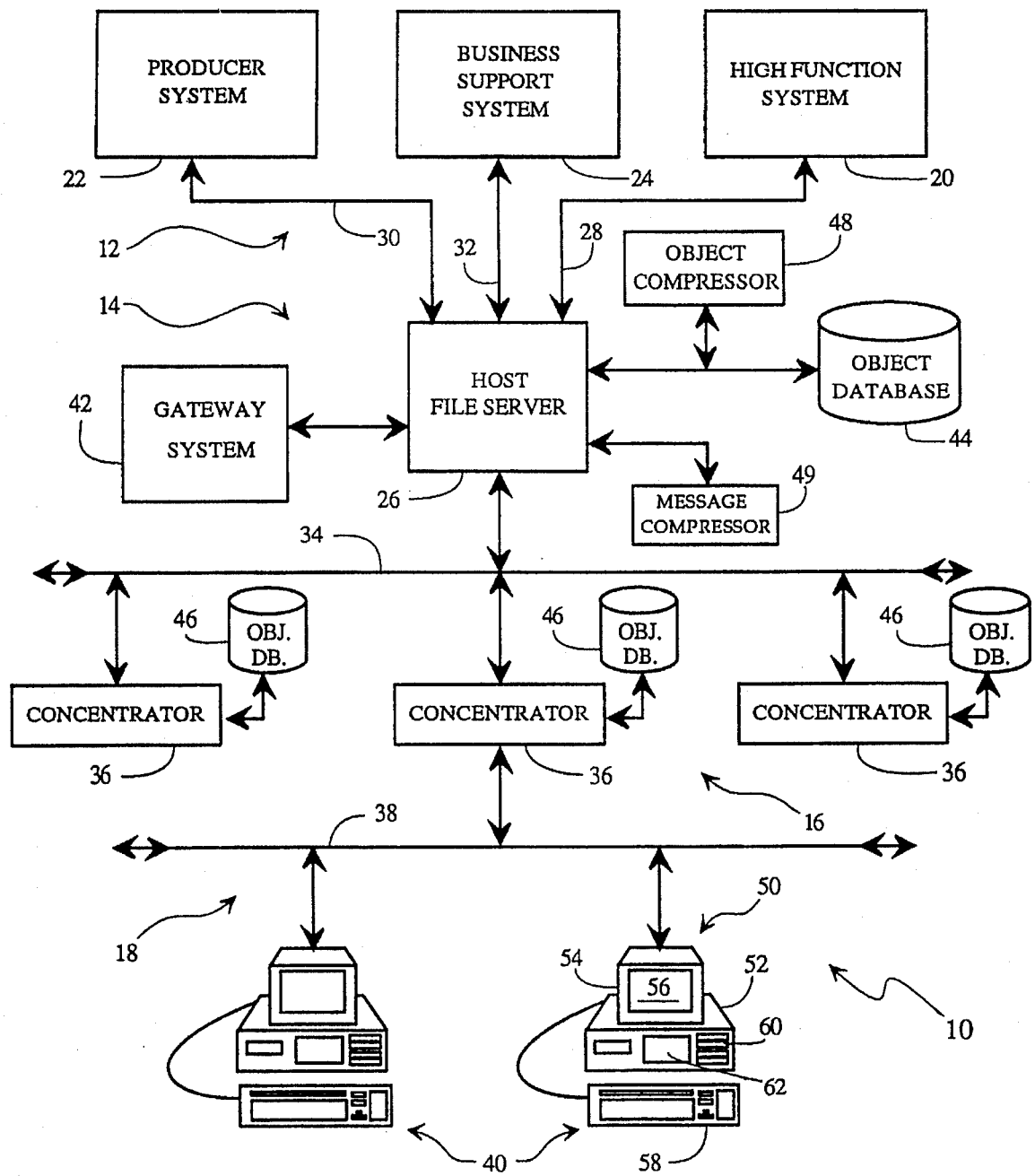
FIG. 1 is a schematic block diagram of the interactive service network in which the compression and decompression method in accordance with this invention may be employed.

As noted above, the growth of digital data communications and database management has given rise to wide acceptance and praise for computer-based, interactive informational and transactional services. Success in providing such services, however, has stimulated subscriber appetite for even more comprehensive performance. Once having experienced the utility and enjoyment such services can provide, subscribers now seek features that include even more information, enhanced with still greater amounts of graphics. And, subscribers want these information-enriched features supplied to them with yet less wait time.

Unfortunately, there are constraints on the degree to which service providers can enhance their offerings. Bandwidth limitations inherent in the public telephone networks used to supply the services to subscribers restricts the rate at which digital data can be transmitted. Accordingly, service providers are limited in the amount of data they can present per screen and still maintain acceptable wait times between screens.

As also noted, while data compression has long been known to relieve problems of transmission delay and storage limitations, conventional methods of statistical and dictionary-type data compression, whether adaptive or fixed, have not been well suited to the demands of interactive services. In order to make their features available to as broad an audience as possible, services such as PRODIGY have been designed to work with microcomputer systems in wide usage. These system include not only the latest in microcomputer technology, but also, substantial numbers of lower-cost and older IBM, IBM-compatible and Apple units which lack the microprocessors power and storage resources of state-of-the-art equipment.

In the description and explanation of the invention that both precedes and follows, though some technical distinction may be drawn between the terms "compression" and "encoding" where the sense applies, these terms and their variants should be consider equivalent and subject to substitution for one and the other without difference. Likewise, the terms "decompression" and "decoding" and their variants should also be considered equivalents and interchangeable where the sense applies.

In the case of conventional statistical compression, while the source analysis that forms the basis of that methodology can lead to considerable amounts of compression, the approach requires significant CPU and RAM resources to analyze the data stream, build frequency statistics and generate the code words needed for compression. Additionally, significant amounts of disk storage space are required to hold the necessary program code and analysis results. And, time is required to execute the compression and decompression sequences, which, in turn, adversely affect screen presentation performance of the interactive services. Additionally, though the other major approach to data compression; i.e., dictionary-type compression, can also provide significant results and typically do so faster and with less demand on CPU and RAM elements than statistical compression, still, dictionary-type compressors require significant amounts of disk storage space to support the table look-up formats and code word inventories required for the compression process. Still further, adaptive, dictionary-type compression techniques tend to be less effective when used in applications where the sample size is small; e.g., where the data blocks are less that 500 bytes long as in the case of an interactive service such as PRODIGY.

Accordingly, because of their resource-intensive character and other limitations as noted, conventional data compression techniques have not been well suited for relieving transmission delay and storage difficulties associated with data enhancement of interactive services.

The method of this invention, however, overcomes the shortcomings of prior data compression approaches. More specifically, the method of the present invention overcomes the shortcomings of prior approaches by blending the simplicity and speed of dictionary look up with the compactness of statistical source modeling. In developing the present method, it was found that where data generated by the source is context sensitive; i.e., the appearance of one byte in the data stream suggests a particular next byte, and where the frequency distribution of those byte pairs is skewed; i.e., some pairs occurring more frequently that others, as in the case of interactive services such as PRODIGY, an encoding/decoding table based on a limited number of the possible pairs can be compiled, and further, compacted by statistically formulating the compression code words with lengths inversely related to the pair frequency.

Before describing the method in detail, it may be helpful to provide some background concerning the elements and operation of an interactive informational and transactional system such as PRODIGY. A network suitable for supporting the PRODIGY Service is presented in FIG. 1. As seen there, the network, designated 10, features a hierarchical structure. Network 10 includes: a service information layer 12; a switch/file server layer 14; a concentrator layer 16; and a subscriber reception layer 18. As shown, information layer 12 includes elements for processing, producing, collecting, and disseminating service data. More specifically, elements designated 20 handle specialized data processing for the network; elements 22 facilitate production and maintenance of the service databases; and elements 24 deal with subscriber usage and billing. Information layer elements 20, 22, 24 are connected, in turn, to switch/file server layer 14 and a host file server 26 contained therein over lines 28, 30 and 32, respectively, as shown. Further, in this arrangement, file server 26 is connected by line 34 to concentrator layer 16 that includes a plurality of concentrator units 36. Yet further, each of the concentrator units 36, as illustrated by the example shown, are connected, in turn, with respective lines 38 (for simplicity, only one of which has been shown) to a plurality of subscriber reception system units 40 in layer 18.

As part of this design, service databases and their parts are distributed and maintained throughout the network, including the reception layer. The database portions are maintained at the various levels based on a number of considerations, principal among which are usage frequency, storage capacity and data freshness. In this way, current portions of the service most likely to be called for can be quickly deliver to the requesting subscriber reception systems. As will be appreciated, this approach not only reduces the supply burden on the more expensive, higher-level elements of the network, but also, by locating as much data as close to the subscribers as possible, reduces the time required for data delivery.

Continuing with reference to FIG. 1, switch/file server layer 14 is seen to also include gateway systems 42 connected to server 26. Gateways 42 couples layer 14 to other sources of information and data; e.g., other computer systems such as Dow Jones, Sears, etc. In accordance with this design, server layer 14, like concentrator layers 16 and reception system layer 18, may also include multiple servers, gateways and information layers in the event even larger numbers of subscribers are to be served.

Continuing with reference to FIG. 1, each reception system 40 is seen to include a computer unit 50; e.g., one of the type supplied by IBM, Apple or their competitors, having a CPU 52 companion RAM and ROM memory, a monitor 54 with screen 56, a keyboard 58 and the other elements commonly associated with a personal computer. Further, computer 50 typically also includes one or more floppy disk drives 60 and hard disk drive 62. Still further, each computer 50 is provided with suitable operating system software for managing the units resources; e.g., CPU, RAM and disk, and application software (not shown, the details of which are more fully described in U.S. Pat. No. 5,347,632, issued Sep. 13, 1994, the entire contents of which patent are incorporated herein by reference) for supporting the interactive sessions with network 10.

A reception systems 40 configured as described, is capable of operating in the PRODIGY network and compiling the two types of data provided by the service, specifically, objects and messages. Objects constitute the fundamental data building blocks for supporting the network, while messages facilitate communication by and between the network, its subscribers and the outside world; e.g., gateways.

With regard to objects, in accordance with service design, screen sequences presented at a reception system 40 are intended to accomplish a particular purpose; e.g., present information, permit transactions, etc., and are referred to as "applications." Each application is itself made up of; i.e., partitioned into, objects. As such, the objects constituting the informational units available from either the limited storage facility established at the reception systems by the reception system software to support a session, or from higher levels within network 10 as noted above. Objects are formatted as uniform, self-defining information entities interpretable by reception system 40, and include data types, such as programs and presentation data for display at the subscriber's monitor screen 54. In this plan, objects typically represents either part or all of a screen; i.e., page of information. When reception system 40 seeks to compose an application; e.g., in response to a subscriber request entered at key board 58, the objects that make up the application partitions are collected from the reception system storage or when not available there, retrieved from higher levels in network 10 as noted. Once collected, reception system 40 can proceed to present the application at screen 56. Thus, objects perform the function of providing the data necessary to present the application portion requested, control the flow of data relating to the application, and otherwise support the subscriber session.

Objects are of various types and are specialized to the function they perform in supporting the subscriber session. Particularly, there are objects for defining screen format; e.g., screen dimensioning, drawing points, etc.; objects for establishing screen elements such as text and graphics to be displayed; objects for defining screen windows which may overlay the base screen with data; objects containing program instruction to be executed in connection with a presented screen; e.g., entry and processing of data by a subscriber in connection with a transaction; objects for presenting advertising at the screen; and objects for organizing the elements of a screen and orchestrating its presentation; i.e., the screen recipe.

In this arrangement, objects are themselves made up of sub-blocks of data that are selectively collected to define the objects and resulting pages that ultimately constitute the application presented. More specifically and as shown schematically in FIG. 2, objects 64 are predefined, variable length records consisting of a fixed length header 66 and one or more self-defining record segments 68, each of which may be structured to perform a specific function as more fully described in the above-referenced U.S. Pat. No. 5,347,632.

Figure 2:
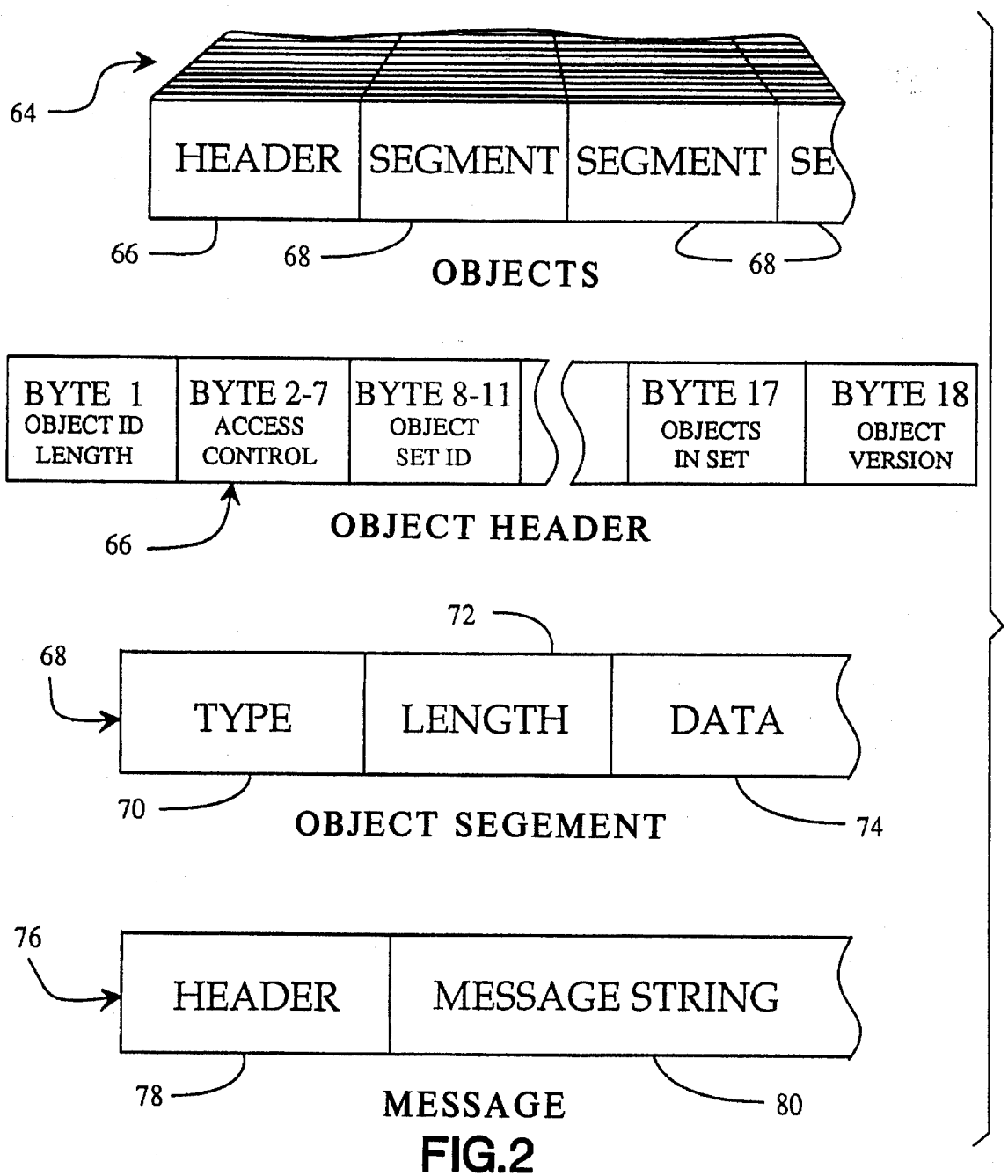
FIG. 2 is a schematic diagram of the data structure used in the interactive service network in which the compression and decompression method in accordance with this invention may be employed.

As shown in FIG. 2, object header 66 includes approximately 18 bytes and contains a prescribed sequence of data which provides information regarding the object's identification, its anticipated use, association to other objects, its length, and its version and currency. More particularly, each of the 18 bytes of header 66 are arranged in a fix pattern to facilitate interpretation by network 10. For example, and as illustrated, the first byte of header 66 identifies the length of the object's identification number. The next six bytes; i.e., bytes 2 to 7, identify access control for the object, to allow, for example, control over who the object may be provided. As will be appreciated, the ability to earmark objects in advance of requests enables the network to anticipate demand and pre-collect objects from the large inventory the service must maintain, with the result that the network is rendered more efficient and response time reduced. The following 4 bytes of header 66; bytes 8 to 11, are used to identify the set of objects to which the object belongs. It will be appreciated that for speed of access and efficiency of selection, the objects are arranged in groups or sets which are likely to be presented to subscribers sequentially in presenting the page sets; i.e., screens, that go to make up a session.

Following identification of the object set, the next bytes of header 66 provide such information as location of the object in the set of objects; designation of the object type; e.g., page format, page template, page element, etc.; object length, which may be what ever length is necessary to supply the data for creation of the desired screens; the storage characteristic for the object; i.e., the criterion which establishes at what level in network 10 the object will be stored; and the basis upon which it will be updated; the number of objects in the set to which the object belongs; and an identification of the object version.

As also shown in FIG. 2 and as noted above, in addition to header 66, objects includes one more of segments 68 each of which may be of a particular type to carry out the purpose of the object or further describe its character and makeup. Segments 68 are the basic building blocks of objects, and, as in the case of objects, have a specific segment structure. Particularly, and as shown, segments 68 includes a designation of segment type 70, identification of segment length 72, followed by the data 74 necessary to implement the specific purpose of the segment and its associated object. With this arrangement, a segment may be provided which is an extension of the object header itself, and contain additional information relating to the object; such as, the type of compression used if any. Alternatively, specialized descriptor segments may be used to identify particular object features; such as, the nature of the compression etc.

In accordance with this design, objects are typically on the order three to five hundred bytes long and, accordingly, because of their relatively small size, are not well suited to adaptive, dictionary-type compression as pointed out earlier.

In addition to objects, network 10 also includes messages. In accordance with the design of the service and as more fully described in the co-pending application noted above, messages, are data structures that enable information to be communicated between subscriber and network, subscriber and subscriber, or otherwise among network elements to support the subscriber session. With reference to FIG. 2, a simple message data structure denoted 76 is composed of two functional parts: a message header 78 and message body 80 which is typically text, but which can also be application data. The message header is of prescribed form and is interpretable by the network elements to identify the message origin, destination and purpose, and to further facilitate transport of the message through the network. The message body 80 is simply the data string comprising the message text or application data, as the case may be.

As in the case of objects, messages are organized in a family of types based on the message function as defined by its header 78. Particularly, there are headers which contain routing and control information; headers which contain transport level information; headers which contain gateway information; headers which contain information for secondary routing; i.e., messages passed from node to node; headers which contain network management information; and headers which contain application-to-application management information, where, for example, applications running at reception system 40 need to be rendered compatible with applications running on an external computer connected to network 10 through a gateway 42.

With this design, and as more fully described in the above-referenced U.S. Pat. No. 5,347,632, to provide network operational compatibility, each message header is formatted so that it defines the header type, length and indicates whether additional headers follow which facilitate message reply. Still further, each header also identifies its source and destination. Switching applications are provided at network elements that route the messages in accordance with the designated destination and available communication resources. Further, in this arrangement, in order to send a response to a message, the recipient application simply swaps the content of the destination and source fields and returns a reply message.

Returning to consideration of the present method, given the diversity of applications an interactive service such as PRODIGY can provide; e.g., news, commentary and features concerning current events, business, sports, politics, etc., as well as shopping for all types of goods and services, and given the wide range of subscriber tastes that exists, it would be expected that redundancy and predictability of bytes in the network data stream would be limited. However, in developing the present method, it was found that for an interactive service such as PRODIGY, the occurrence of bytes in the data stream tend to be context sensitive; i.e., the appearance of one byte in the data stream tends to suggest the next byte. Further, it was found that the frequency distribution for byte pairs is substantially skewed; i.e., some pairs occur more frequently that others. Particularly, it was found that for the approximately 65K byte pairs possible (since each byte of a pair includes 8 binary bits, there are a total of 256×256 or 65,536 possible pairs), approximately 80 percent; i.e., 52K pairs, have zero occurrence frequency. Further, of the remaining approximately 13K pairs, the highest frequency counts occur among approximately only 4K of those pairs, and within those 4K pairs, the occurrence frequency of the second byte was found significantly dependent on the presence of the particular first byte.

In view of these findings, it was felt that substantial compression of the interactive service data stream could be achieved, within the constraints imposed by the subscriber equipment; i.e., limited computing resources, particularly disk storage space, if byte compression was based on fixed, look-up tables of the 4K most frequently occurring byte pairs. Further, it was felt that the degree of compression could be increased if the lengths of the code words used to encode were made dependent on the frequency of occurrence of the byte pairs. And, it was additionally believed that degree of compression could be made still greater if the code word lengths were made dependent upon the particular first and particular second byte of the respective pairs. Yet further, it was believed that still more compression efficiency for the process could be realized if the bytes of non-selected pairs were transmitted compressed in accordance with a context-free encoding scheme. Thus, in accordance with the invention, the method is seen to include fixed, look-up tables having statistically derived code word entries.

Figure 3:
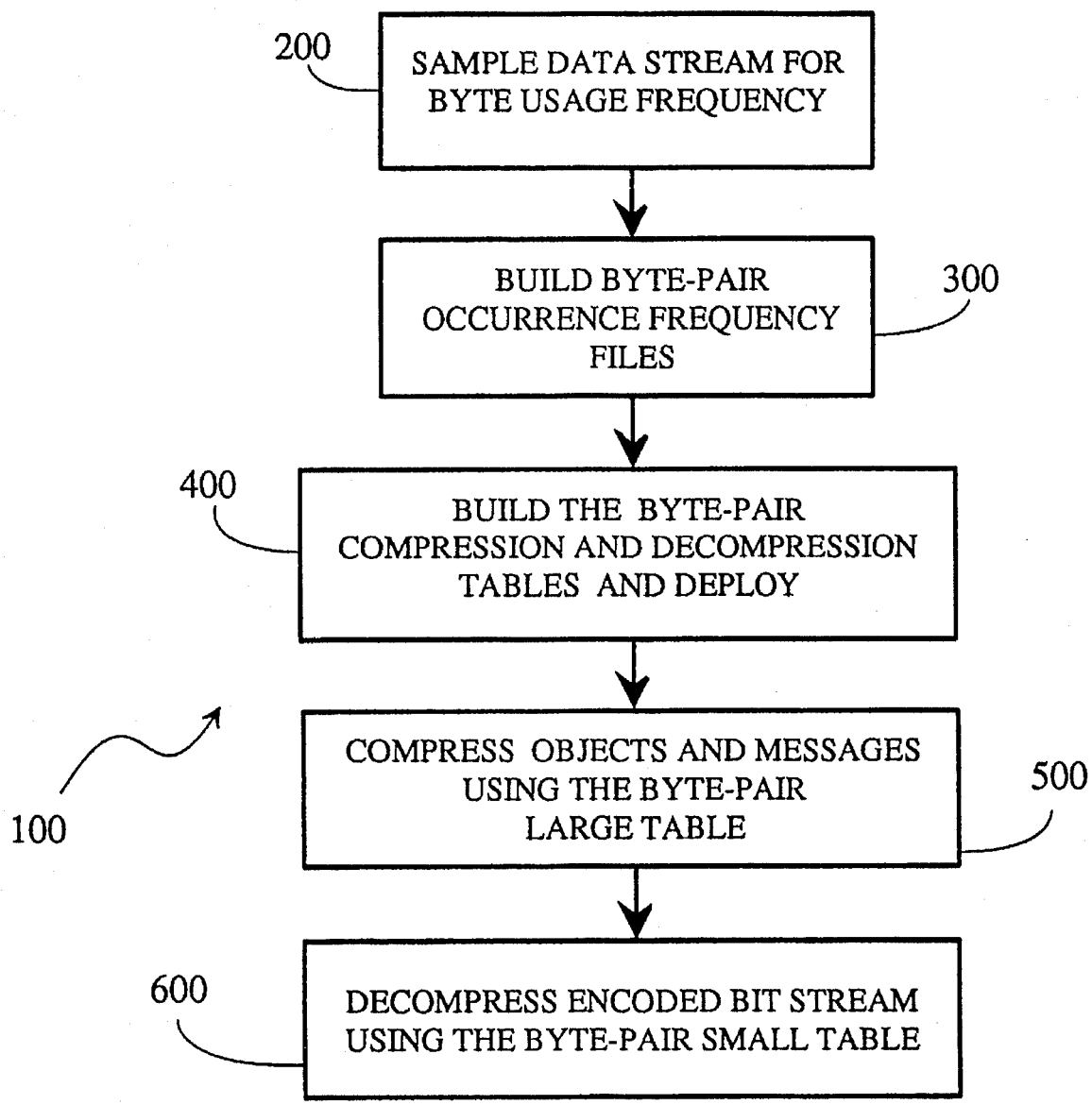
FIG. 3 is a flow diagram in general form that shows the over-all step of the compression and decompression procedure for the method in accordance with this invention.

A first preferred form of the method in accordance with the invention is shown in general terms in FIG. 3. As seen there, method 100 broadly and preferably includes: steps 200 for sampling the service data stream to identify the most popular objects and their associated bytes; steps 300 for building data files containing ranked byte-pair frequencies; steps 400 for building the fixed, look-up tables for compression and decompression and deploying them in the network; steps 500 for compressing objects and messages; and steps 600 for decompressing the bit streams received.

With regard to sampling steps 200, in formulating codes intended for use in data compression, it is important to assess the frequency of occurrence of specific data in the data stream; i.e., characterize the symbol source based on the data patterns produced. In this way, code words for at least the most frequently appearing data can be provided. For a system such as PRODIGY, source characterization can best be done by sampling object usage. More specifically, this can be accomplished by determining the identity and occurrence frequency of objects that have been stored at caches 46 of network concentrators 36 shown in FIG. 1. As will be recalled, objects are required to compose the applications displayed at subscriber monitors 54, and are supplied on demand from the various storage facilities established within network 10; e.g., reception systems 40, caches 46 of concentrators 36, and main database 44 of host server 26. In this plan, the objects stored over time at concentrators 36, best reflect average service usage; i.e., demand by the subscriber population as represented by data traffic over lines 38. Objects Stored at server 26, on the other hand, represents the entire service; i.e., all objects, and accordingly are independent of usage, while objects stored at each reception system 40 reflects only the usage of a particular subscriber.

Figure 4:
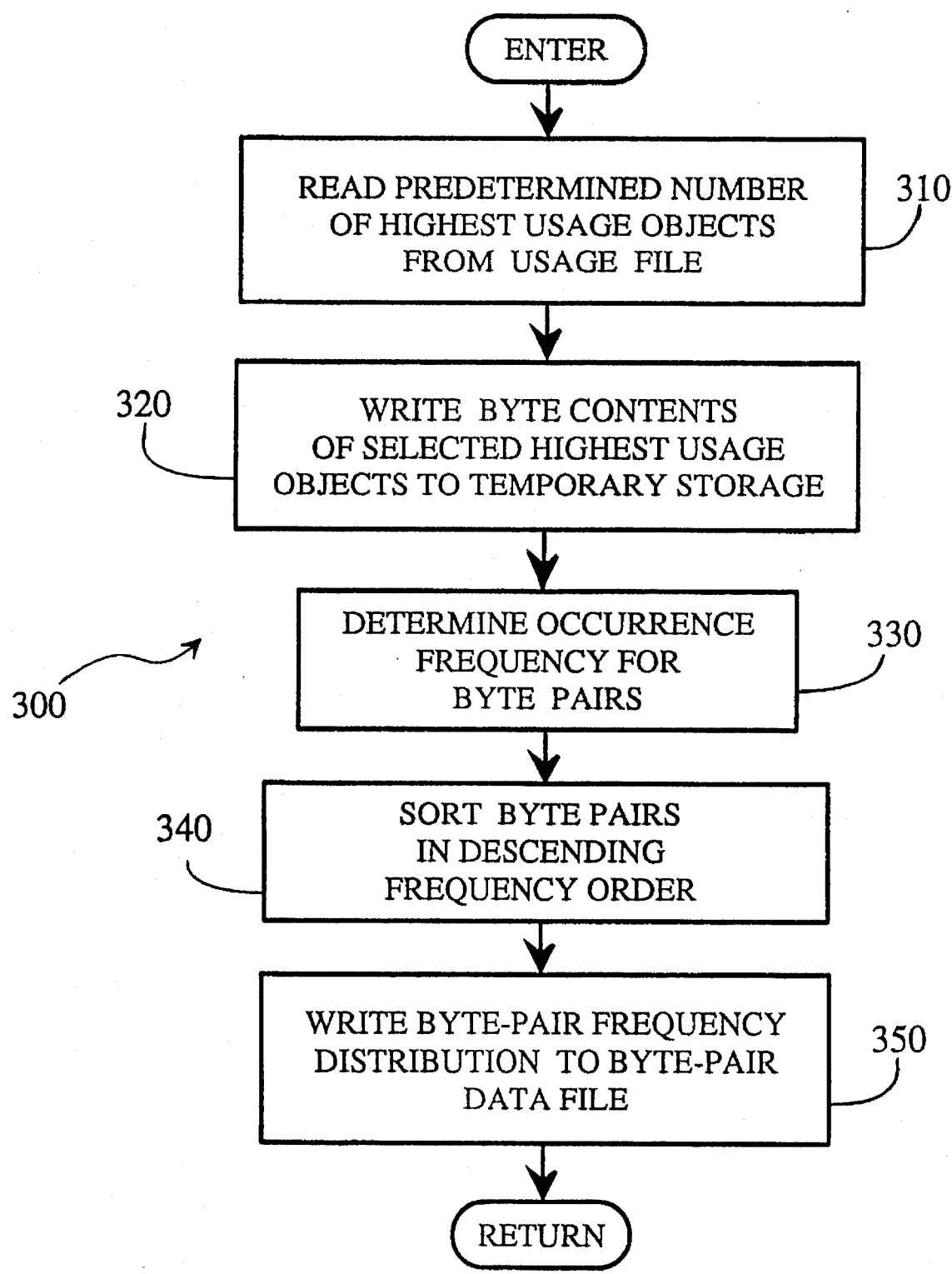
FIG. 4 is a flow diagram of the step for building the byte-pair frequency files used in the compression and decompression method in accordance with this invention.

The procedure for sampling the service data stream and building the pairs frequency file is shown in FIG. 4. As seen there, the pairs frequency files are prepared by performing the steps: 310, reading a predetermined number of the highest usage service objects; 320, writing the byte contents of the select high usage objects to temporary storage; 330, determining the occurrence frequency of the byte pairs; 340, sorting the byte pairs in descending frequency order; and 350, writing the byte-pair frequency distribution to a byte-pair data file.

In network 10, concentrators 36 maintain records of the number of times various objects are requested by reception systems 40 to support subscriber interactive service sessions. In accordance with the preferred form of the method, these "use" records are accessed and read and a predetermined number of the highest usage objects identified and their frequencies noted in accordance with step 310. For interactive service such as PRODIGY, experience has shown that approximately 80 percent of the service usage involves only approximately 20 percent of the service data. Accordingly, the 400 highest usage objects of the approximately 2,000 objects in the service are ascertained from several concentrators 36, and designated to constitute an object training set.

Thereafter, in accordance with step 320, the known byte constituents for the objects of the training set are written to a buffer in the form: <b1><b2> pair frequency, to determine at step 330 the byte-pair frequency given the object usage frequency. Subsequently, in step 340, the byte pairs are sorted in descending frequency order to produce a ranked listing of approximately 65,536 pairs to establish a byte-pair frequency distribution (as earlier noted, each byte includes 8 bits, thus, there are a total of 256×256 or 65,536 possible pairs). The ranked list of byte pairs is thereafter saved by writing to a data file in step 350.

Following determination of the byte-pair frequency distribution, the encoding and decoding tables can be created. As discussed, the principal concern for implementing a compression scheme in an interactive service is the demand on subscriber reception system resources: e.g., processing and storage facilities. In accordance with the method of the present invention, those demands are minimized by organizing the compression, decompression scheme around context-sensitive, look-up tables that are based on a limited number of byte pairs. Further, the compression process is made yet more efficient, by using code words whose lengths depend on byte pair frequency of occurrence; i.e., statistically determined code words. And, in accordance with the preferred form of the method, yet additional efficiency is realized by making the code word length dependent on the occurrence frequency of the particular first bytes and particular second bytes of the respective selected pairs. Still further, in accordance with the preferred form of the method, yet greater compression efficiency is realized by transmitting the bytes of non-selected pairs found in the data stream with a context-free encoding scheme.

Figure 6:
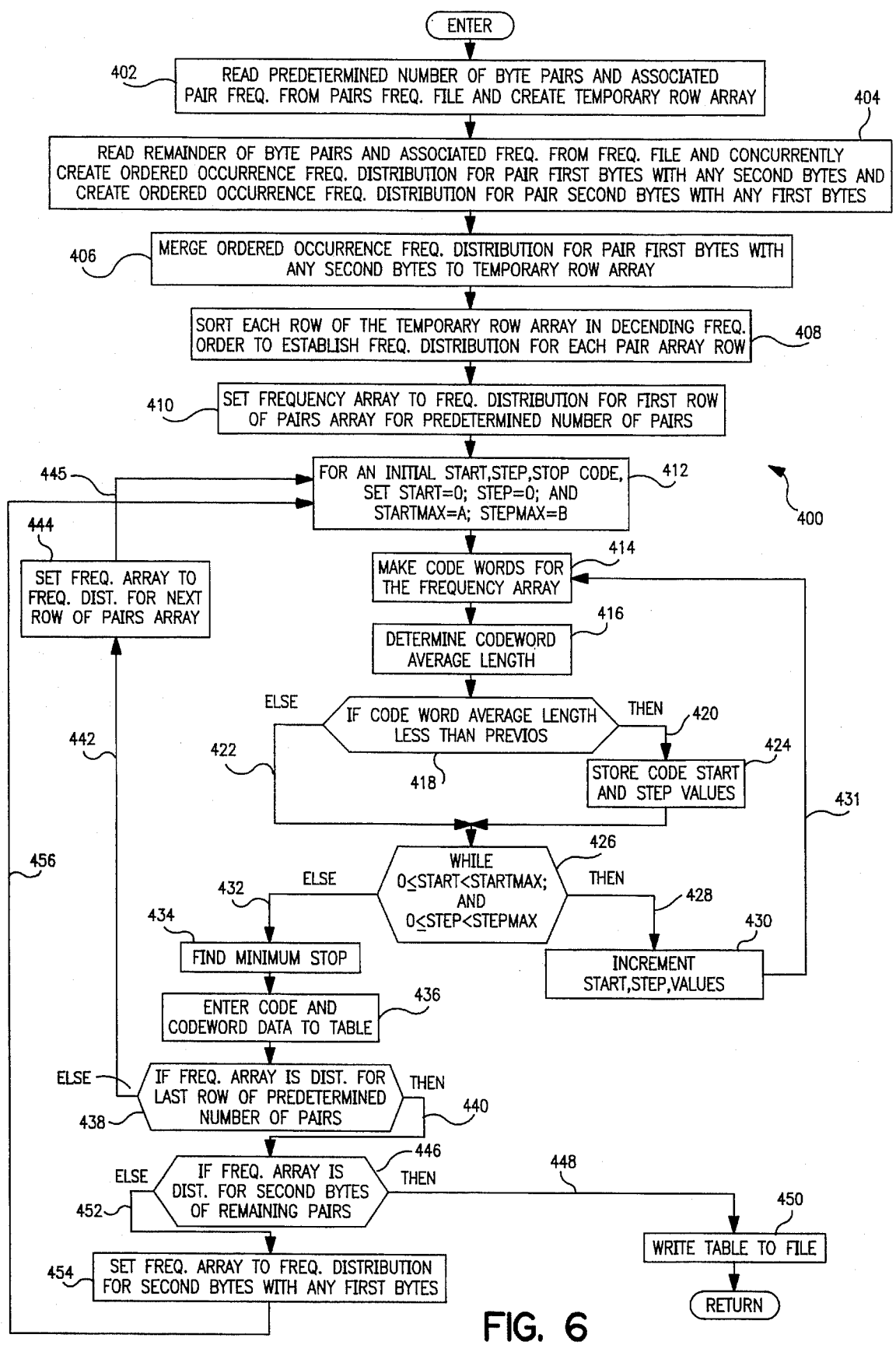
FIG. 6 is a flow diagram of the steps for building the encoding and decoding tables used in the compression and decompression method in accordance with this invention.

The procedure for creating the encoding and decoding tables in accordance with the invention is shown in FIG. 6 as the series of steps designated 400. In the most general expression of the method, a single table format can be used to carry out both data compression and decompression. Further, the single form of the table can be used at multiple locations within the network; e.g., at host 26 and reception systems 40 to support transmission of compressed data both to and from the subscribers.

However, in preferred form, the method features use of two different, but, related formats for the byte-pair tables; i.e., a large table for compression and a small table for decompression. Additionally, in preferred form, the system features transmission of compressed data in only one direction; i.e., from the network higher level elements to the subscriber, and not from the subscriber to the higher level elements. Compression in network 10 is preferably undertaken in only one direction in order to maximize compression speed. Because the data traffic from the subscriber to higher levels of the network is typically low, transmission delay and demand on network resources for storage of subscriber generated data is also low. Accordingly, the associated cost in response time that would result if data were compressed at the reception system using a small table; i.e., a table that could be readily accommodated by the reception system, is unjustified in view of limited saving in transmission delay and storage burden that might result if compression were enabled at the reception system.

As will be appreciated by those skilled in the art, where data traffic from the subscribers to the network becomes significant; e.g., where substantial subscriber "E-Mail" is generated and required to be stored, compression of data at the subscriber equipment may be desirable. In this regard, and as will be further described below, in addition to using the large table for compression and the small table for decompression, it would be possible to also use the small table for compression, and the large table for decompression.

Alternatively, and in accordance with the broad aspect of the method, a single small table and companion procedures; i.e., programs, could be used throughout the network for both sending and receiving compressed information. In fact, in view of the size advantage, the small table of the preferred embodiment is favored for the single-table approach even though compression speed may be less than what might be realized using a large table. Accordingly, since the small table is fundamental to the broad aspect of the method, and since it is also basic to the preferred form of the method; e.g., decoding, it may be helpful to discuss its features first.

Regarding makeup, in general form, the small table includes a pairs array and a table-information array. The pairs array is structured as a plurality of rows, one row for each of the 256 possible pair first bytes. Since a byte is defined as having eight bits, there are $2^8$ different bit patterns possible which, in turn, give rise to 256 different possible pair first bytes. Further, the second bytes for each of the pairs having a frequency above a predetermined level are located in descending order of occurrence frequency, one after another into the respective rows identified by the pair first bytes.

In preferred form, to minimize the size of the small table, only the second bytes of the respective pairs are included in the pairs array. By locating the pair second bytes in positions within the array from which the respective pair first bytes may be implied, express inclusion of the pair first bytes may be dispensed with and the ability to recognize the respective pairs maintained. Specifically, by designating each array row as a row for a particular pair first byte, assignment of the specific pair second bytes to that row identifies the respective pairs. For example, by identifying a particular array row, the pair first byte is identified, and by identifying the pair second byte within the row, the pair is identified. Further, since each bytes is unique, as noted the system bytes consisting of 256 different bit patters, the correlation of pair first bytes and row may be simply achieved by arranging the row physical assignments in conventional byte order; i.e., from 0 to 255.

In preferred form, the 256 row array is a linear structure with one row following another. Further, the rows are subdivided in bytes and separated by boundaries designated by byte counts measured from the array beginning. Accordingly, any byte pair in the array can be identified by designating a pairs array offset which includes a row designation component that measures the length in bytes from the array beginning to the beginning of a row, and a displacement component that designates the count in bytes into the respective row where the byte location may be found. And, with this arrangement, each byte pair of the array can be identified by an offset into the table, the first byte of the pair being identified by the table row, and the second byte of the pair by the displacement into the row. As will be appreciated, while in preferred form the array is a linear structure, it could also be arranged as a two-dimensional structure of successive rows, one row positioned beneath another.

Additionally, in preferred form, the table includes a context-free byte array to permit processing of bytes not part of pairs whose constituents can be compressed using the pairs array. As will be appreciated by those skilled in the art, since any byte the network can generate could be included in a pair not within the pairs array, the context-free byte population includes all 256 bytes of the network. Therefore, Since there are 256 context-free bytes, in accordance with the invention, they are conveniently arranged with one located in each of the 256 rows of the pairs array. Further, in compliance with the preferred form of the table, the context-free bytes are distributed among the respective pairs rows in descending order of context-free byte occurrence frequency; i.e., the most frequently occurring context-free byte being in the first pairs row (0) and the least frequently occurring context-free byte located in the last pairs row (255). With this arrangement any of the context-free bytes can be identified with an offset into the context-free array, the context-free offset itself including a base offset defined by the pairs-array row plus a context-free displacement into the pairs row where the context-free byte is located. As will be appreciated, the context-free byte location, therefore, is not reachable with a pairs-array offset, the pairs-array offset not having a valid displacement to a location occupied by a context-fee byte.

As noted, in its general form the small table also includes a table-information array. The table-information array includes data that facilitates use of the table. In accordance with the invention, the information array is arranged as a plurality of information elements, one for at least each of the rows of pairs array. In general form, each of the elements may include one or more bytes containing data concerning such matters as the boundaries for the rows of the pairs array and the code information associated with the respective pairs rows as will be described more fully below. Further, in preferred form, the table information array may also include information concerning the context-free byte array and its associated code information to be described.

With regard to the pairs array, the "predetermined" frequency level established for pair inclusion in the pairs array is selected based on the size table desired; i.e., a table size that will be readily accommodated at the reception system. As will be apparent to those skilled in the art, as the size of the table increases; i.e., as more pairs are included, the compression ratio for the system tends to improve since more pairs are available for the compression process and less use of the lower efficiency escape procedure is required. However, the relationship between table size and compression ratio is not linear, and above an optimal level dependent on the byte-pair frequency distribution and the frequency distribution of particular pair second bytes with particular pair first bytes, increases in the number of pairs; i.e., table size, does not produce incremental increases in the compression ration. Stated otherwise, compression ration tends to saturate as pair count increases. In practice, a pairs array of approximately 4,096 pairs; i.e., 4,096 pair second bytes, in 256 rows, plus the context-free bytes and associated supporting data of the information array, for a total table size of approximately 5,381 bytes is preferred and found to produce compression rations of output byte length to input byte length of approximately 0.6. Further, a table of such size is found to be readily accommodated in a reception system based on any of the more modest personal computers above noted.

With reference to FIG. 6, and the general table-building procedure 400 shown there, the first step 402 in creating the small table is to read the top 4,096 byte pairs together with their respective frequencies from the pairs frequency data file created in steps 310 to 350 of FIG. 4, and establish the pair array by writing the pairs to the table as a series of rows containing the respective pair second bytes. In accordance with the above described array structure, each row, as noted, is indexed by the first byte of a selected pair, the boundaries for the rows of the 256 possible first bytes being provided in the table-information array, which in preferred form in arranged as the 257th row of the table. As described, the second bytes for each of the selected pairs are located in the respective row for each pair first byte, and are arranged displaced into the row in descending order of pair frequency. Given this structure, any second byte of a selected pair included in the array, as noted above, can be identified with an offset into the table that includes identification of the array row; as for example, with a byte count form the array beginning to the row start boundary, and a byte count displacement into the row; i.e., a value, where the pair second byte is located. In accordance with the method of the invention, the offset value is unique, and the displacement portion of it can be used to generate a code word which can be substituted for the second byte of the pair to effect compression when the second byte of a selected pair is found to follow the pair first byte in the data stream.

In accordance with the invention, this encoding process, can be made yet more efficient if the lengths of the code words used to represent the second bytes are made dependent on the byte-pair occurrence frequency. And, the encoding process can be made still more efficient if the length of the code words are made dependent on the occurrence frequency of the particular pair second byte with the particular pair first byte. In accordance with the preferred form of the invention, to realize this enhanced efficiency, separate optimized codes for each of the array rows are generated; i.e., a pairs code for each of the 256 pairs rows. In accordance with the invention, start-step-stop unary code, well known in the art for establish code words whose lengths are dependent on the occurrence frequency of a symbol to be represented, are used to generate the desired variable-length code words for each the pair rows. While a start-step-stop code is preferred for its simplicity of generation and ease of use, other codes having word lengths dependent on the occurrence frequency of the symbol to be represented; e.g., Huffman encoding, could also be used. Once the code words are established, they can be associated with the respective displacements into the rows and the respective row identifications; i.e., boundaries, such that when a pair second byte is found to follow a particular first byte in the data stream, a code word can be generated whose length is dependent on the occurrence frequency of the particular second byte with a particular first byte.

Figure 5:
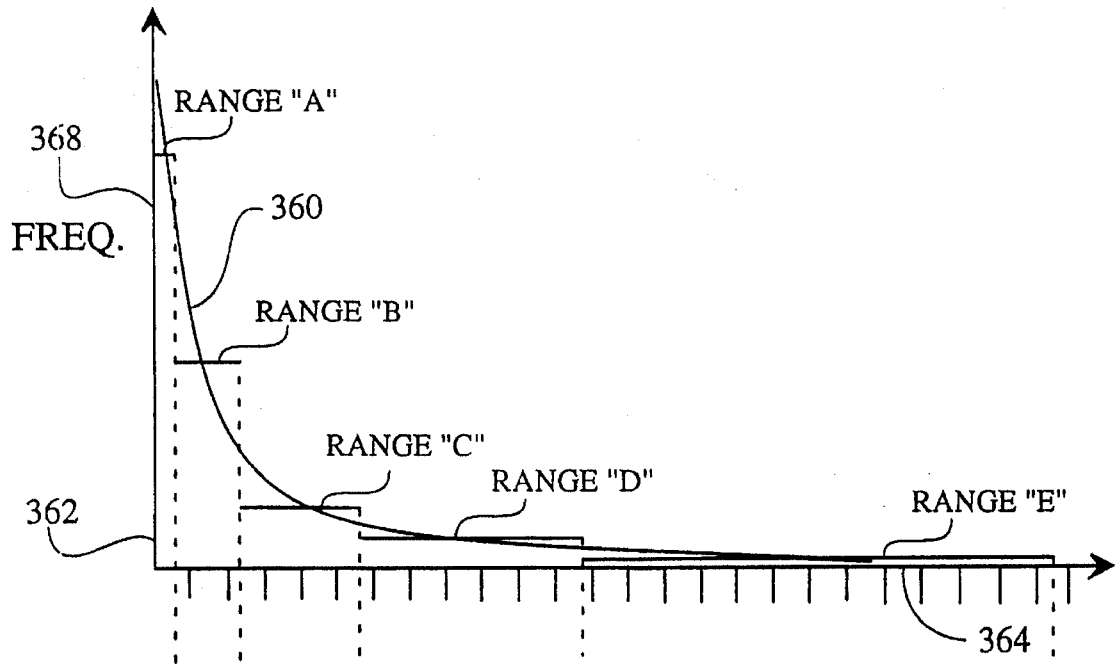
FIG. 5 is an illustration of a byte-pair occurrence frequency distribution and sample start-step-stop code that might be employed in formulating byte-pair code words used in the encoding and decoding tables of the compression and decompression method in accordance with this invention.

A fuller appreciation of the relationship between the row displacement value and the start-step-stop codes may be obtained by referring to FIG. 5. In FIG. 5, a sample start-step-stop code is illustrated at 370. By their design, start-step-stop codes are capable of generating interpretable, variable-length, binary code words that can uniquely represent the elements of a group or set; e.g., the pairs second bytes of a particular array row. As shown in sample 370, for given start-step-stop parameters, code words can be generated having ascribable "ranges" and "values", defined by a code word prefix and field. In this scheme, the prefix is an indicator; i.e., a symbol, for the code word range, and designates a range initial value, while the field determines a range increment; i.e., a number, expressed in binary form, that is added to the initial value to produce the code word value. As seen in the example, the range initial values are cumulative between ranges. Accordingly, with this scheme, the prefix and field can define a unique value or number for any code word. Code word length, in turn, is determined by the number of binary bits required by the prefix and field to express the desired code word value. In accordance with start-step-stop code design, and as shown, the code words for the Nth range have a prefix of N 1's followed by 0, and a field of size equal to "start" plus the product of N times "step." Further, when the field size equals "stop", the 0 in the prefix is dropped and code finish with an all 1's fill for the last code word.

Continuing with reference to sample 370, for the example values of start equal 2, step equal 1 and stop equal 6, a set of code words is produced having five ranges; i.e., A to E, that encompass values from 0 to 123, and have lengths of from 3 to 10 bits. As is apparent from the sample, the code "start" value establishes the number of bits in the initial code word field, and according, the sweep of values included in the first range. Further, the code "step" value is seen to set the increment in code word field length added each time the code word range is advanced, and, accordingly, the increase in code word value as ranges change. Additionally, from the illustration, it is seen that code word length is increased by an amount equal to step plus one, each time the range is advanced. And finally, it can be seen that the code "stop" value sets the code word field length for the code final range, and accordingly, the code end value; i.e., the number of code words in the set.

Once words for a code are defined, they can be assigned to substitute for the symbols of any other set or group; e.g., a set of variable frequency symbols such as the pair second bytes of a particular row of the table pairs array. Further, since the start-step-stop code words are each unique, they can be assigned as desired to the variable-frequency symbols; e.g., by simply associating the shortest code words with the highest frequency symbol. And, as will be appreciated, that association may be effected by correlating the code word value defined by the prefix and field, with the symbol frequency ranking; i.e., the ranking of the pair second byte for a given first byte of a particular array row, which, because of fill procedure for the rows described above, is the displacement in into the row where the pair second byte is located. In accordance with the present method, this feature of the start-step-stop code is used to create an association between the start-step-stop code words and the respective table pairs. Particularly, the code word values are correlated with the frequency rankings of the particular second bytes of the respective row pairs as expressed in the small table to establish an association between code words and the displacements into the table rows where the second bytes identify the pairs.

The basis for establishing the association between row pairs and start-step-stop code words is graphically illustrated in FIG. 5. In FIG. 5 an example frequency distribution 360 for pair second bytes of an arbitrary row of the pairs array is presented at plot 362. As shown, the plot horizontal axis 364, enumerates second bytes for pairs of a particular row that arises when the select ranked pairs of the frequency data file produced at steps 310 to 350 of FIG. 4 are used to create the table array. The plot vertical axis 368 increments occurrence frequency of the particular pair second bytes with the pair first byte that defines the row. Overlaying the frequency distribution 360 for the pair second bytes are the code word ranges for the sample start-step-stop code illustrated at 370. As is apparent, any pair second byte included in the frequency distribution; i.e., identified on the plot's horizontal axis, can be uniquely associated with a start-step-stop code word simply by substituting the second-byte ranking value for the code word value. Stated otherwise, a second-byte ranking value can be used as a start-step-stop code word value, and the code word prefix and field generated using that value and the start-step-stop parameters for the code. Further, and with regard to the small table, since the table structure permits the pairs of a row to be uniquely identified with designation the row and the displacement into the row, the row displacement is uniquely related to the pair, and through the pair second-byte frequency ranking in the row to the code word values.

As will be appreciated, because the array rows are filled in descending pair frequency order, the row displacement values are the same as the ranking values for pair second-bytes. Accordingly, the displacements can be directly used to identify a code word values, and given the particular set of start-step-stop values for the row, generate the corresponding binary code word.

However, as will be discussed more fully below, in preferred form the second-byte population of each row; i.e., plot axis 364, also included the escape code word for the respective row first byte, i.e., the code word indicator generated when a byte considered for compression does not form a pair with the first byte that can be compressed with the pairs array. Accordingly, the presence of the escape code word in the row frequency distribution creates a "hole" in the row not usable by the start-step-stop code since there is no pair second byte at the frequency ranking for the escape code word to which a displacement relation can be established. And, as will also be discussed below, in accordance with the invention, the method takes advantage of this fact to place a context-free byte at that location.

Continuing, where code word assignment is for the purposes of compression, as in the present method, in order to maximize compression efficiency, it is essential that the average code word length be a minimum when the code is used to substitute code words for bytes in the data stream. However, as is apparent from example 370 of FIG. 5, the average code word length will depend not only on the frequency distribution for the symbols, but also, the particular start and step parameters selected for the code. On the most superficial level it is plain that in order to maximize compression, it is necessary to have as many short code words as possible to accommodate the highest frequency symbols. However, where the start and step values are selected to maximize the number of short code words, average code word length increase rapidly if more ranges must be used, as in the case of larger symbol populations having more dispersed frequency distributions such as might arise were particular first bytes form many selected pairs with different second bytes. On the other hand, if start and stop values are selected to increase medium length code words, average code word length may be unnecessarily high where the symbol frequency distribution is skewed; e.g., where the high frequencies are confined to few pairs.

Therefore, in accordance with the invention, procedure 400 shown in FIG. 6 for building the small table includes steps to not only select a start-step-stop code for each table row, but in preferred form, steps to optimize the code selection based on the particular second-byte frequency distribution per row that arises from the byte usage sampling. More specifically, steps 410 to 434 of FIG. 6 concern the generation of a start-step-stop code that optimize the average code word length for the given pair second-byte frequency distribution of an array row.

As seen in FIG. 6, following reading of the predetermined number of pairs from the ranked frequency file created in step 310 to 350 of FIG. 4, a temporary pairs row array is created at step 402 of the table building procedure. The purpose of creating the temporary array is to transform the frequency file data from pairs arranged by frequency alone, to pairs arranged by particular first bytes, particular second bytes and frequency. This is done in order to establish the pair second bytes frequency distribution for particular pair first bytes; i.e., the respective row frequency distributions, used to develop the start-step-stop codes for the respective pairs rows.

In accordance with the invention, the temporary array is two dimensional having a plurality of rows, one for each of the 256 possible pair first bytes, and a plurality of columns, one for each of the 256 possible pair second bytes. As will be appreciated, this arrangement produces an array of 65,535 cells similar to the large table format described above. However, in the case of the temporary array, each of the cell is filled with the pairs frequency obtained from reading the frequency file for the predetermined number of pairs.

Accordingly, in the temporary array, the frequency values for the predetermined pairs are distributed in accordance with the rows of pair first bytes and columns of pair second bytes. As will be appreciated, for the pairs not selected; i.e., the remained of the pairs of the frequency file, their cells are zero filled.

While at this point the stage would be set for simply producing the pair second-byte frequency distributions needed to find the optimal start-step-stop codes by sorting row frequencies in descending order and dropping zero frequency cells; i.e., non-selected pair second bytes, in accordance with the invention, steps are take to render the method more efficient by facilitating compression for the bytes of non-selected pairs; i.e., context free bytes.

Particular, provision must be made for handling bytes not part of pairs included in the small table; i.e., so called context-free bytes. As suggested earlier and as will be described in more detail below, during compression, data stream bytes of pairs to be encoded are looked up in the small table to determine if a code word for them can be provided. If the byte is part of a pair not included in the table, the byte can not be encoded in a context-dependent manner; i.e., based on pairs information, but rather, must be treated in a context-independent manner; i.e., alone. In a general form of the method, context-free bytes can be handled by simply transmitting an "escape code" i.e., a predetermined code word selected to indicate the next group of data bits of defined length is being sent uncompressed, followed by the byte itself. As will be appreciated, with this approach, a simple escape code would be stored in the table and used as required during encoding. This approach, though simple, nonetheless detracts from compression efficiency due to the transmission of uncompressed context-free bytes.

In preferred form, the method of this invention overcomes such inefficiency by including steps for not only encoding context-dependent bytes; i.e., bytes of the selected pairs, but also, a scheme for encoding the context-free bytes and their associated escape codes as well. To accomplish this, the byte pairs of the frequency file prepared with procedure 300 that are not selected for inclusion in the table; i.e., pairs having frequencies below the set predetermined level, are analyzed to enable merger with selected pair so that the two schemes can work together and to establish a supplemental frequency distribution for which an additional compression codes can be established and used.

As shown in FIG. 6, following the reading; i.e., selection, of the predetermined number of pairs for the pairs array at step 402, the remaining pairs; i.e., pairs below the predetermined level in the pairs ranked frequency file, are read at step 404. However, as noted at steps 404, only a single byte of the pair and the pair frequency are respectively noted. This is done to organize the bytes of these pairs in two separate groups, one to define a frequency distribution for establishing escape codes and another to define a frequency distribution for establishing context-free byte codes.

As will be appreciated, use of an escape sequence is dependent upon the frequency with which a first byte is followed by a second byte that results in a non-selected pair; i.e., a pair having an occurrence frequency below the prescribed level. Thus occurrence of the escape sequence is context sensitive like occurrence of the pair bytes, and, is capable of being integrated with the row frequency distributions to be formulated as a set of codes, each of which is dependent of the particular first byte of a non-selected pair. However, because a particular first byte may appear with a number of different second bytes to cause an escape sequence, the frequency of a particular escape code will depend only on the frequency of the particular first byte among all the non-selected pairs. This escape code frequency distribution can be readily determined by reading and arranging the frequency of non-selected pairs by particular first bytes and summing those frequencies over all non-selected pairs. Thereafter, the sums for the respective first byte frequency can ranked with the selected pair second bytes to provide the escape frequency distribution. As will be discussed, this is done by merging the frequency distribution for the pair first bytes with any second bytes of the non-selected pairs in the temporary array as noted at step 406.

With regard to the context-free bytes, though the second byte of non-selected pairs will appear with a variety of first bytes, the frequency of particular second bytes in the escape sequences; i.e., context-free encodings, dependents only on the occurrence frequency of particular second bytes among all non-selected pairs. And, as in the case of escape codes, the frequency of particular second bytes in the non-selected pairs can be readily determined by reading and arranging the frequency of non-selected pairs by particular second bytes and summing those frequencies over all non-selected pairs. Thereafter, the sums for the respective second byte frequency can be ranked to provide a context-free frequency distribution. The summing and ranking of second byte frequencies among non-selected pairs to establish the context-free frequency distribution is undertaken also at step 404 shown in FIG. 6.

As will be appreciated by those skilled in the art, both the ordered occurrence frequency distribution for pair first bytes with any second bytes and the ordered occurrence frequency distribution for the pair second bytes with any first bytes of the non-selected pairs can be conveniently obtained by concurrently accumulating the respective sums over the pair first bytes and over the pair second bytes as the non-selected pairs are read from the pairs frequency file.

Continuing, following reading of the non-selected pairs to establish the frequency distribution for the pair first bytes with any second bytes; i.e., the escape code frequency distribution, and the pair second bytes with any first bytes; i.e., the context-free byte frequency distribution, in accordance with the method, the pairs encoding scheme and the context-free encoding scheme are integrated by merging the escape code frequency distribution, with the temporary row array. In the merger, the respective escape frequencies; i.e., the frequencies of any non-selected second bytes with the respective row first bytes; are placed as frequency values in the rows of the respective pair first bytes. Following the merger of the escape frequencies in the temporary array, the temporary array rows are sorted in descending frequency order and the temporary array rewritten in the small table format; i.e., the string of selected pair second bytes in the plurality of rows indexed by the pair first bytes as described above.

However, as a result, of the merger of the escape frequencies with the temporary array, a "hole" is created in each of the respective pair first byte rows where the escape frequency resided, there now being no selected pair second byte to fill the position in the row frequency distribution where the escape frequency existed. Accordingly, those holes; i.e., one for each row, can later be used to accommodate the context-free byte distribution developed at step 404 above noted.

Following merger, sorting and of creation of the respective rows of the small table at steps 406, 408, the respective second-byte frequency distributions are available from which the optimal start-step-stop codes can be created. Accordingly, at step 410, the pair second byte frequency distribution for the first table row is be set to the frequency array for the start-step-stop code optimization to find the optimal code for that row. Thereafter, at step 414 the initial start and step parameters are selected to create a first code.

In conventional fashion, initial parameters are set for the code to assure proper termination of the procedure. Specifically, the initial values are set to zero and the maximum values set to assure that a will accommodate the number of pair second bytes in the respective row; i.e., the population of the row. As will be appreciated, this can be conveniently done by setting the maximum start to a value that will permit the code prefix to generate a sufficient at step equal zero to accommodate the row population. Likewise, the maximum step is set to accommodate the row population when start is equal to zero.

Continuing, since the values of start and step are the principal contributors to average code word length, they are the parameters adjusted to find the minimum average code word length for the symbol frequency distribution to be represented. Stop, on the other hand, concerns the code ending, and is dictated by the number of elements in the distribution to be substituted for. It, therefore, can be determined once the start and step parameters for minimum average code word length have been found.

In accordance with the method a further advantage of selecting start-step-stop codes is that the number of variants for code parameters are relatively few. Therefore, an optimal code; i.e., one that provides the shortest average code word length for the pair second-byte frequency distribution of a row, can be readily found by permutating the start and step values and comparing the resulting code average word length. Further, since the number of reasonable values for start and step are also limited for a given distribution, the number of permutation are, themselves, limited. In preferred form, and in accordance with the discussion above concerning the needs to satisfy row population, experience has shown that for the byte population encountered in the PRODIGY service, a simple selection such as startmax equal 7, stepmax equal 3 will provide an adequate selection to begin the optimization procedure. As seen in FIG. 6, the initial start and step values are set at step 412.

Continuing with reference to FIG. 6, once the frequency distribution is defined and initial start and step parameters selected, a set of code words is generated at step 414 in the manner described and illustrated at sample 370 of FIG. 6. And, following creation of a code word set, the average code word length is determined at step 416. As is well known in the art, following creation of the code word set, an average code word length can be conveniently determined by simply multiplying the frequency of each symbol; i.e., each pair second-byte frequency, by the length of code word assigned to the respective pair second byte; i.e., length of prefix plus field, and, thereafter, dividing the sum of all the such products by the total number of symbols; i.e., pairs in the respective row. In preferred form this procedure can be simplified by merely determining the sum of the frequency-length products instead of dividing to find the average code word length.

Once the average code word length or comparable characteristic for the selected code parameters and frequency distribution has been determined, it is compared at step 418 to a reference value; e.g., an average length calculated for a previous code, or the uncompressed byte length if the calculation is the first, to determine if the currently selected start and step parameters provide an improved code over the previous; e.g., a code that yields a shorter average code word length for the given frequency distribution. If average code word length is less that than the previous, the currently selected start and stop values are stored at 424. Subsequently, whether the code for the current start and step values produce a reduction in average code word length or not, the procedure repeats for all values of start and step between the initial values of zero and the maximums set at step 412. As will be appreciated by those skilled in the art, this finding of the best values for start and step can be conveniently effected with conventional "do while" and "increment" procedures at steps 426 and 430, respectively, that loop the average code word length or comparable parameter determination procedure over all start and step values between zero and the set maximums as shown in FIG. 6.

Following determination of the best start and step code values and storage of those values, the procedure determines the code value for stop that will accommodate the number of pair second bytes included in the frequency distribution; i.e., the select number of pairs for the row. This is conveniently done by exiting the "do while" procedure at 432 once looping is exhausted and finding the stop parameter that will give a code word value at least as high as the total number of pairs to be encoded for the particular row at step 434. Thereafter, the stored optimal start and step values and the computed stop value, can be entered in the table at step 436. As will be discussed more fully below, instead of storing the stop value; i.e., the maximum size of the code field, it is preferred to store the maximum 1's value of the maximum prefix size. Since the maximum 1's value is a smaller number that the stop value its representation can be more efficiently stored. Further, because maximum 1's value adequately identifies the code word final range, no loss in information results from the economy. In this regard, it should also be noted that in preferred form, the optimized start, step and maximum 1's value for each array row can be conveniently stored in the table information array; i.e., row. For example by storing the start value as three bit, the step value as two bits and the maximum 1's value as four bits. Also in accordance with the preferred form of the invention, once the optimal start-step-stop code parameters for a row have been determined the are saved to the table-information row.

As noted above, the table-information row is a data array that contains the data required in using the small table. Specifically, the information is arranged as a plurality of information elements, one for at least each of the rows of pairs array. In general form, each of the elements may include one or more bytes containing data concerning the boundaries for the rows of the pairs array and, as noted, the code information associated with the respective pairs rows, specifically, the optimized start-step-stop code parameter and the escape frequency code value. In preferred form, the table-information row includes four bytes per element, two bytes to designate the beginning boundaries for the respective row, and two byte to designate the row escape code and the start-step-stop parameters. With this arrangement, the 4,096 byte location of the 256 rows can accommodate nominally 16 second bytes per row; i.e., pairs per row. However, as will be appreciated, since the byte boundaries are adjustable by virtue of the two byte boundary value; i.e., address, the number of second bytes per row can be adjusted to accommodate the pairs frequency distribution of the frequency file.

In addition to the two boundary byte, the table information element includes two bytes for the escape code word for the respective row, and the row start-step-stop parameters. In preferred form, the escape code is afforded seven bits to designate the displacement into the respective row where the escape "hole" exists. As will be appreciated, since the locations into a row are arranged in descending frequency order, and since by virtue of merger and sort steps 406, 408, the escape code is placed in a location dependent on its relative frequency, the location; i.e., displacement, into the row where the hole exists is variable and constitutes the escape code word value for the respective row pair first byte.

Continuing, the remaining nine bits of two bytes allocated for the escape code and the start-step-stop parameters are taken by the optimal values start, step and prefix maximum 1's. As noted, in preferred form, three bits are used for start, two for step and four for stop.

Once the optimal start-step-stop code for the first row of the pairs array has been found and stored, the table building procedure causes the optimal start-step-stop codes to be found and stored for the other rows of the pairs array. More specifically, and with reference to FIG. 6, following identification and entry of optimum code parameters for a row of the pair array at step 436, procedure 400 determines at step 438 whether an optimal start-step-stop code has been found for the last row of the pairs array. This is accomplished by testing to see if the frequency array for the optimal start-step-stop code determination is set to the frequency distribution for the last row of the table. If this condition is not satisfied, the process branches at 442 to set the frequency array for code optimization to the frequency distribution for the next row of the table pairs array at step 460. Thereafter, the process proceeds again to step 412 to find an optimal start-step-stop code for the next array row in a manner described above.

As shown in FIG. 6, once optimal start-step-stop codes have been found for all the respective array rows, and the frequency distribution for the last array row encountered, the condition at step 438 is satisfied and the procedures branches at 440 to continue the table building process.

As will be appreciated by those skilled in the art, in the preferred practice of the method, optimized start-step-stop codes are created for each of the array rows in order to maintain average code words length as short as possible. By creating new codes for each array row, the number of code values required, and hence the length of the respective words is kept to a minimum. As is apparent from the discussion above and example 370 of FIG. 5, the more code values used; i.e., the larger the population for which code words are needed, the more increments in code range will be required and the greater will be the cost in increased field length and prefix length. Accordingly, to reduce the effect of word length mushrooming and the attendant adverse impact on compression efficiency, the preferred form of the current method seeks to use as many short codes as possible.

This strategy of using many, short codes to minimize of average code word length, and maximize compression efficiency, comes at the expense of finding a plurality of optimized codes. However, in accordance with the invention, the burden of multiple determinations is reduced by using start-step-stop codes. As shown in FIG. 6, the simplicity of start-step-step code manipulation renders multiple determinations and optimization readily manageable. Moreover, the burden of the multiple determinations is further lessened by requiring that it only be sustained when the table is built. Once created, the advantage of the table structure can be enjoyed without further expenditure.

However, and as will also be appreciated, should it be warranted, it would be possible to use a single optimized code having words of frequency dependent length for the entire pair array. In such a situation, a code such as proposed by Huffman noted above would likely be of advantage.

As in the case of the table pairs, code words having lengths dependent on the context-free frequency distribution can be conveniently generated with start-step-stop codes to render the context-free encoding more efficient; i.e., shorter. Moreover, in accordance with the method of the present invention, start-step-stop codes for context-free bytes can be selected in the course of procedure 400 for building the small look-up table. This is done by setting the code optimization frequency array to the frequency distributions for the context-free bytes generated at step 404, and returning to the code optimization steps 412 through 436.

More specifically, and with reference to FIG. 6, following identification and entry of optimum code parameters for the last pair array row at step 438, procedure 400 determines at step 446 whether the last phase of the procedure has been completed; i.e., whether the optimal code for the context-free bytes has been found. As shown, this is done by determining whether the frequency array for optimization is set to the context-free frequency distribution; i.e., the frequency distribution of second bytes with any first bytes of the "remaining" pairs. If it is not, as in the case where only the optimal pair-array code has been found, the process branches at 452 to set the code optimization array to the context-free frequency distribution; i.e., the frequency distribution for non-selected second bytes with any first bytes, at step 454.

Thereafter the procedure returns at 456 to step 412 to begin the sequence of finding the optimal code start, step and stop values as described above for optimization of the codes.

Subsequently, the procedure again encounters step 446 to assess whether the last phase of the procedure has been undertaken. This time, however, because the frequency array is set to the to the context-free byte distribution, the condition is found satisfied and the procedure branches at 448 to step 450 where all table data is written to a table file. In this regard, it is to be noted that in the preferred form of the small table, the pairs array is arranged as 256 rows, where a row is provided for each possible first byte and the second bytes of the selected array pairs are arranged in descending frequency order into the respective rows. Thus, any of the array pairs can be identified by the above described pairs array offset; i.e., row identification and displacement into the row.

Additionally, and as noted, in preferred form, the table also includes a context-free byte array ordered as one location for each of the 256 pair-array rows; i.e., the holes associated with the escape code words. For this arrangement, each of the possible 256 context-free bytes the system may produce is disposed in the holes array in descending occurrence frequency order as determined by the context-free frequency previously discussed. Accordingly, any of the context-free bytes my be identified with an offset into the context-free array; i.e., an offset which may include a base, offset that identifies the row and a context-free displacement value that can be used to generate the context-free code word.

Once the small-table pairs array and the table information array have been created, the table can be used to encode. The parameters for the row codes enable the generation of the appropriate code word given a table offset for a pair identified with the pairs array; i.e., first byte row and second byte displacement into the row. In this regard it should be again noted that rather that the code stop value, the table stores the code word prefix maximum 1's count. As will be described more fully below, the prefix maximum 1's count is of more use in the decoding procedure that the code stop value. Additionally, the table information row as noted includes the actual 256 escape code words for each of first bytes. Still further, the table information row also includes the start-step-stop parameters for the context-free code that permits a context-free offset into the table to generate the context-free encoding. Specifically, in addition to the 256 data elements for the pairs code, the table information row also includes the parameters concerning the optimized context-free start-step-stop code. As with the pairs code, the context-free code information includes the more helpful maximum 1's count rather that the code stop value.

Continuing, as explained, in preferred form, a large table is used for the byte-compression procedure in order to improve speed. In accordance with the compression aspect of method, as the data stream is read, the current byte is looked up in the compression table to see if the current byte when considered in context of the preceding byte establishes a byte pair for which a compression code has been provided. If the current byte and prior byte constitute one of the select pairs, a code word is identified and transmitted in place of the current byte. However, if the current byte and prior byte do not constitute a pair for which a code word is provided, an escape code and context-free code for the current byte must be identified and transmitted in place of the current byte.

Based on the prior description of the small table, it will be appreciated that where the small table is used for compression, the method requires the row of the pair array for the prior byte be accessed to see if the current byte can be found at any of the second-byte displacements into the row other than the context-free location. If the current byte is found within the prior byte row, the displacement into the row is noted and used thereafter in a subsequent computation that generates the corresponding code word using the start, step and stop parameters for the array row provide in the table-information row. If the current byte is not found in the row of the prior byte, the procedure requires the escape code for the prior byte be identified at the table-information row and the current byte looked up in the context-free byte array. When the current byte is found in the context-free array, the context-free array offset; i.e., row identification and displacement into the row is noted, and the context-free code word generated using the context-free code parameters for start, step and stop provided in the table code information row.

From this description, it is apparent that a number of table look ups and computation are required where the small table is used for encoding. Accordingly, it is also apparent that if some of the procedures required with the small table were eliminated, the encoding process could be accelerated. The large look-up table enables that result.

In accordance with the preferred form of the invention, the large table is structured to eliminate the need for subsequent computation following table look ups. Specifically, in the large table, an array is again provided based on the 256 rows of the small table; i.e., one row for each of the possible pair first bytes. However, in the large table the array is expanded to include 256 columns, one for each of the possible pair second bytes. Further, the 65,536 cells identified by the first-byte and second-byte coordinates of the array each include a four byte data entry that contains the pre-generated pair code word or escape code word and context-free byte code word as well a length descriptor for the codes. In this arrangement, separate start-step-stop codes are used for the selected pairs of the respective rows. Therefore, though the table has been expanded to approximately 262K bytes, any code word, whether pair code word or escape code word and context-free byte code word can be immediately provided given a prior byte and a current byte, with the same degree of compression efficiency; i.e., average code word length that might be attained with the small table. However, since all code words are pre-generated, the need for "on-the-fly" computation is minimized and the chance for error significantly reduced.

Since the large and small table are based on the same data, it will be appreciated, though the large and small table differ in format, they relate to the same pair, escape-sequence and context-free frequency distributions and are fully compatible. Accordingly, any byte compressed with the large table can be identified and decompressed with the small table.

Figure 7:
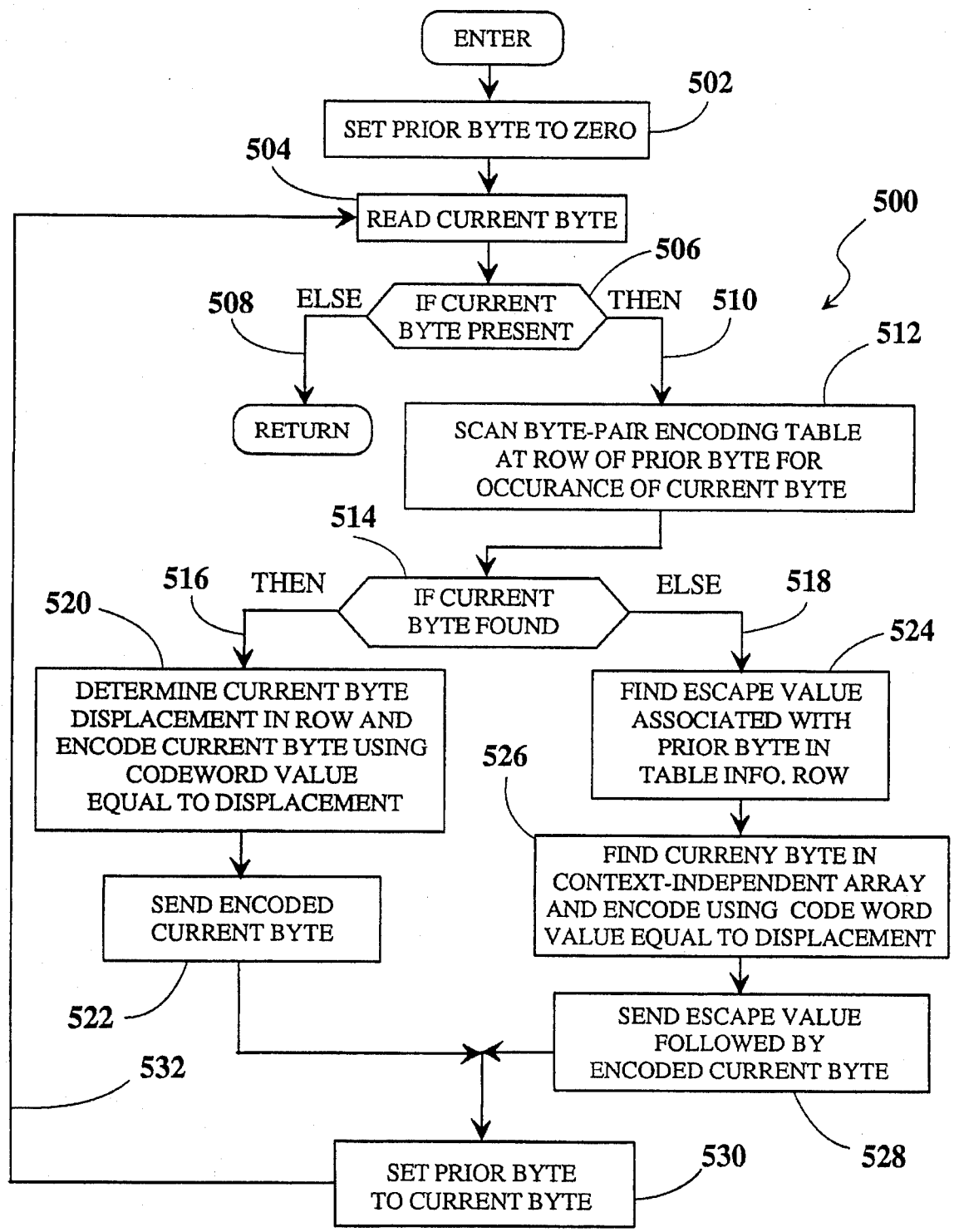
FIG. 7 is a flow diagram of the steps for encoding data with the compression and decompression method in accordance with this invention.

A flow diagram for the compression procedure in accordance with the method is shown in general form in FIG. 7. As seen there, the compression procedure designated 500 includes a first step 502 for setting the prior byte to zero. As explained, the compression-decompression processes of this invention is based on the idea that a current byte may be effectively compressed and decompressed; i.e., recovered, if the prior byte is know. For this approach, the shortened code word to be substituted for the current byte is based on the byte pair defined by the current byte and the prior byte. Accordingly, before the procedure can begin, a prior byte value must be provided to initialize the process. In preferred form, when the process begins, the first prior byte is arbitrarily set to zero. As will be appreciated, other selection could be made; e.g., the byte having the highest probability of appearance. However, whatever the chose, the decoder must make the same assumption in order to maintain the compression and decompression procedures in agreement.

Following initialization, the current byte of the data stream is read at step 504. Thereafter, the read is tested at step 506 to see if any data exists for encoding. If no data exists, the procedure branches 508 and terminates. However, if at a current byte is available for encoding, the procedure branches at 510, and scans the compression look-up table to see if the current byte and prior byte constitute a byte pair for which a compression code word has been provided. As explained earlier, the specifics of the subsequent encoding procedure vary some what depending on whether the small table or large table are used. Where the small table is used, the pair-array row of the prior byte is interrogated to determine if it includes the current byte as noted at step 514. If it does, the table offset to the location that identifies the pair; i.e., first-byte row and second-byte displacement into the row, is used to generate a code word at step 520 given the pair code start-step-stop values for the row stored in the information row of the table. The generation of the code word is in accord with the description provided above in connection with sample 370 of FIG. 5. Particularly, given the start and step values for the row pairs code and the ranking of the pair; i.e., the code word value, a code word prefix and field are generated that are provided to the compressor output at step 522. Ideally, the bit count of the code word is less that the current byte's eight bits to effect a compression.

Where the small table is being used, if the current byte is not found at step 512 to be in the pairs array, the procedure at step 514 branches over 518, to find at step 524 the escape code for the prior byte stored in the table information row. Subsequently, the procedure then locates the current byte at the context-free array, and provides an displacement value that permits the context-free code word to be generated using the start and step values stored in the table information row for the context-free code. Thereafter, the procedure at step 528 sends the escape code word and context-free byte code word to the output for transmission.

Once the current byte has been transmitted as either a pairs code word or as the escape code word and context-free byte code word, the procedure at step 530 sets the prior byte to the current byte and returns at 532 to data stream read step 504 to repeat the procedure.

As described, where the large table is used for compression, the compression is the same, except, that instead of generating any code words, the code words, whether pairs or escape code and context-free, are immediately fetched form the appropriate cell of the 256×256 prior and current byte array and provided to the output for transmission.

From the description of the encoding process and the start, step and stop code word makeup, it will apparent that code words generated will not uniformly follow the byte boundaries for ordinary data. In accordance with the present method, this is managed by maintaining a byte position pointer that identifies the byte of normal boundary in which the code word string ends, and a bit position pointer that identifies the bit at which the code word string ends within the byte of normal boundary. Further, as the code words are generated, the are added to the output within the normal byte boundaries. If a code word string exceeds a normal boundary, the overflow is carried to the next normal boundary byte position. Thereafter, subsequent code words are filled immediately after the preceding code word in the available bit positions within the normal byte boundaries. And, any subsequent overflow, again, is carried to the next normal boundary byte position. However, and as will be appreciated, the bits of the code words are always arranged within the normal byte boundaries with the least significant bit aligned right most.

Following compression, the next phase of the process to consider is decompression. The procedure for decompressing code words in accordance with the method of this invention is shown generally in the flow diagram presented at FIG. 8. Before discussing the procedure, it should be noted that in the field of data compression, it is conventional for the compression and decompression steps to be complementary; e.g., in the case of dictionary compression, use of identical compression and decompression tables with inverse procedures, This is done to avoid any chance of data loss during the translations. As described, however, in preferred form, the compression and decompression processes of this method are performed somewhat differently in order to reduce demand on the reception system resources, while, at the same time, maximizing process speed. Information lost that might otherwise arise from the asymmetrical procedure, however, is avoided by basing the compression and decompression processes on tables that derive from the same byte-pair, escape sequence and context-free data.

Figure 8:
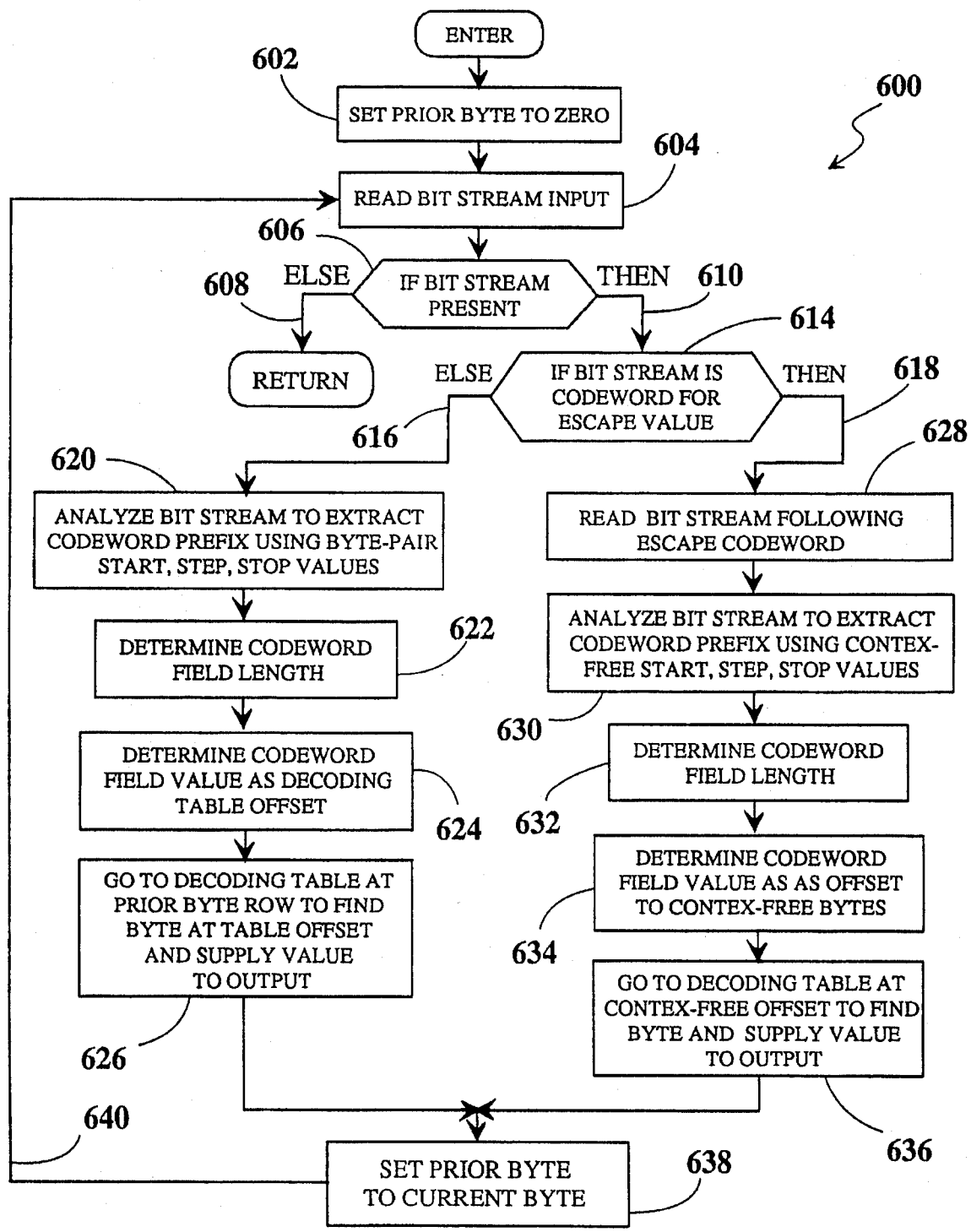
FIG. 8 is a flow diagram of the steps for decoding data with the compression and decompression method in accordance with this invention.

In accordance with the preferred form of the method, the decompression procedure shown in FIG. 8, is carried out with the small table described above. However, as will be appreciated by those skilled in the art, decompression could also be undertaken with the large table. As seen in FIG. 8, the decompression procedure for the small table designated 600 includes a first step 602 for setting the prior byte to zero. The decompression process, like the above-described, companion compression processes is based on the idea that a current byte may be compressed and decompressed if the prior byte is know, the code word substituted for the current byte being based on the byte pair defined by the current byte and the prior byte. Accordingly, before the decompression procedure can begin, a prior byte value must be provided to initialize the process. However, the decompressor must make the same assumption as the compressor in order to maintain the overall process in harmony. Accordingly, since the preferred form of the compressor assumed the initial prior byte to be zero, the decoder makes the assumption and initialize the decoder by setting the first prior byte to zero.

Once initialized, the decoding procedure reads the compressed bit stream of code words substituted for the original data bytes at step 604. Subsequently, the read is tested at step 606 to determine if any bit strings are presented for decoding. If no bit string exists, the procedure branches at 608 and terminates. However, if a bit stream is available for decoding, the procedure branches at 610, and scans the string of bits. Initially, the procedure analysis the bit string to determine if it is the escape code word associated with the prior byte. As will be recalled, in the table-building process, specific escape code words were generated to represent the call for an escape sequence in connection with specific prior bytes and stored in the small table information row. Given the identity of the prior byte, here set to zero, the decoding procedure can access the appropriate escape code and compare it with the incoming bit stream. If the bit stream is not the escape code for the prior byte, the procedure branches at 616 and undertakes further analysis.

In accordance with the invention, at step 620, the procedure first selects a number of bits from the string corresponding to maximum length of a pairs code word given that a particular has proceeded it. The maximum number of bits for a code word in the context of the prior byte is determined by the pairs start-step-stop code information for the row defined by the prior byte stored in the table-information row. As will be recalled, the length of a code word is equal to the bits in the code word prefix, plus the bits in the code word field. Further, it will be recalled that for the code word of maximum length; i.e., the last code word, the word prefix is filled with 1's and the number of 1's is equal to the code N value; i.e., maximum 1's value. Still further, it will also be recalled that the maximum 1's counts for the codes of the respective rows are stored in the information row in place of the code stop values at the time of table creation. Accordingly, they are readily available for the decoding procedure. Continuing, with regard to the maximum field length, it will be recalled that field length is equal to start plus N times step, and since N is known from the maximum 1's count, the length of the field is also readily determined. Accordingly, given the maximum length of the prefix and the maximum length of the field length, the maximum code word length is determined. It should also be noted that the beginning of the bit string is always the beginning of a code word. According, and as will be appreciated, a suitable reference for the bit position counting is always available.

Once the maximum length of the pair code word is identified, the bit string is further analyzed at step 622 to determine its actual prefix and the length of the code word field. By design, and as seen in sample 370 of FIG. 5, all code prefixes except the last include a string of N 1's followed by a 0. And, in the case of the final prefix, N 1's alone are provided. Based on this fact, the bit string is examined starting at the string beginning until either a first zero is encountered, indicating the end of the prefix, or the maximum number of 1's for the code are encountered. If a zero is encountered before the maximum number of 1's, the field length is found as start plus N times step where N is equal to the number of 1' in the prefix. If the maximum number of 1's is encountered before a 0, the field length is, again, equal to start plus N times step.

Once the prefix and field length have been determined, the bits of the identified field length are analyzed at step 624 to determine the code word field value and associated code word values in a manner described in connection with the explanation of sample 370 shown in FIG. 5.

Following the determination of the code word value, that value is used as the basis for entering the table pairs array to find the uncompressed form of the encoded byte. As noted the prior byte of a pair identifies the table row in which the pair second byte can be found. Further, the second byte of a pair is found displaced in the row at the displacement in the row equal to the code word value. Accordingly, once the code word value is determined, the table can be entered at the prior byte row and the current byte found at the displacement value location. Once the uncompressed form of the current byte is located, it is presented to the output for use.

Following, decoding of the byte string, the prior byte is set to the current byte, and the beginning of the next code word is identified as following the end of the code word just identified at step 638. Thereafter, the process returns at 640 to the bit stream read step at 604 to repeat the decoding process for the next string of bits.

With regard to decoding step 614, if in reading the bit stream at step 604 it is determined that at step 614 the bit stream includes the escape code for the prior byte, the procedure branches at 618 to analysis the bit stream following the escape code at steps 626 and 630 to determine the context-free code word in accordance with the start, step stop code data stored for context-free code in the table. Thereafter, in a manner substantially the same as the evaluation of the pairs code word described, the context-free code word field length and code word value are determined at steps 632 and 634. And, once the code word value is determined, the table context-free array can be accessed to retrieve the uncompressed form of the context-free byte at step 634, and the byte provided to the output. Following, decoding of the context-free byte string, as in the case of the pairs code word decoding, the prior byte is set to the current byte, and the beginning of the next code word is identified as following the end of the code word just identified at step 638. And, once again, the process returns at 640 to the bit stream read step at 604 to repeat the decoding process for the next string of bits.

With reference to FIG. 1, as explained, in order to maximize compression speed and minimize demand on the resources of the reception systems 40, in preferred form, the compression process in undertaken in network 10 in only one direction; i.e. for server 26 to reception systems 40. And, since compression is undertaken at server 26, the faster and larger look-up table can be readily accommodated without burdening computing resources. More specifically, the compression function; i.e., program, is called by server 26 as part of the object delivery function.

It will be recalled that objects support the subscriber user sessions at reception systems 40, and are composed of large numbers of bytes. As objects are requested from lower levels of network 10, server 26 retrieves the objects from main database 44 and passes them to object compressor function 48 schematically shown between the database 44 and server 26. Thereafter, compressed object 44 compresses the object byte stream, and passes it to server 26 for delivery to concentrator 36 and competent reception systems 40. In accordance with this plan, while compressed objects are not stored at main database 44 in order to conserve maine database capacity, the compressed objects are stored at the concentrator databases 46. As a result, concentrator database 46 may contain duplication of objects in compressed and uncompressed form.

As explained, not all reception systems of network 10 may be able to process compressed objects. In order to receive compressed objects, reception system must be equipped with a compatible decompressor and have indicated the compressors presence in a prior object request. In preferred form, this is easily accomplished by setting a compression flag in a suitable request object header segment as more fully described in the above referenced U.S. Pat. No. 5,347,632, issued Sep. 13, 1994, the contents of which patent are incorporated herein by reference. The decompressor is installed at reception systems 40 if sufficient free storage space exists and is embodied as a set of programs that implement the decoding procedure described above which may be executed by the reception system computer. In the case where a reception system 40 in incapable of receiving compressed objects, if the reception system requests object held at concentrator 36 only in compressed form, concentrator 36, which in accordance with the invention also includes the decompression programs, decompresses the objects and passes them to the requesting reception system.

In addition to objects, network 10 may also compress messages which, as noted above enable communication between the elements of network 10. More specifically, when a competent reception system; i.e. one including the decompression programs, communicates a message, it sets a flag in the above described messages header. Thereafter, when server 26 receives the request it undertakes at message compression function 49 to compress the byte string of the reply message. In accordance with the preferred form of the method, before forwarding the reply, compression function 49 checks to determine if the reply is of sufficient length to warrant compression and whether sufficient compression will result to justify intervention.

As will be appreciated by those skilled in the art, since the compression and decompression procedures of this method are independent of the particular information in the bytes to be compressed, there are no restriction on the nature of the data compressed. The implication of this is that compression and decompression method described here can be used with other compression schemes that may be applied to precondition the data stream. Therefore, in preferred form, the compression and decompression procedures above described are combined with run-length encoding scheme to provide added compression. In this scheme, just prior to pairs compression, the data stream is tested to see if a minimum run of the current byte exists; i.e., if the current byte repeats for at least a predetermined number of times to justify a run-length encoding. If the minimum repeating is present, a conventional run-length program well know in the art is activated and encoding of the sequence is undertaken; i.e., the repeating byte and a number signifying the run length together with suitable identification information is generated, and, thereafter, presented to the pairs compressor as the next byte string to compress. Subsequently, following pairs compression and decompression, the run-length compression is decompressed using a conventional run-length decoder and the data provided in its original state.

While this invention has been described in its preferred form, it will be appreciated that changes may be made in the form, construction, procedure and arrangement of its various elements, and steps without departing from its spirit or scope.

What we claim is:

1. A method for compressing streams of digital data, the data streams including successions of byte pairs in which a current byte immediately follows a prior byte, the data streams being generated by a data source for communication to a receiver, the method comprising:

identifying a prior byte;

identifying a current byte immediately following a prior byte;

scanning a code word supply means for obtaining compression code words from a fixed table included in the code word supply means when a particular current byte immediately follows a particular prior byte, wherein the compression code words have respective lengths that are dependent upon the appearance of particular current bytes immediately following particular prior bytes, the codes words being generated with multiple codes, the multiple codes being determined by particular current bytes immediately following particular prior bytes, and having control parameters that may be adjusted so that the code word lengths are minimized where particular current bytes follow particular prior bytes, the compression code words provided in the table being created by analyzing byte streams of the data source produced prior to compression to develop occurrence frequency information concerning the appearance of current bytes immediately following prior bytes and providing code words at the code word supply means when the frequency of appearance of particular current bytes immediately following particular prior bytes, exceeds a predetermined value;

determining whether a compression code word for the current byte can be obtained form the code word supply means; and communicating a compression code word for the current byte when the compression code word can be obtained from the code word supply means, and communicating an indication when a compression code word can not be obtained from the code word supply means when a particular current byte immediately follows a particular prior byte.

2. The method of claim 1 wherein the compression code words provided at the code word supply means are created using multiple start-step-stop codes, and wherein the indication communicated when a compression code word can note be obtained from the code word supply means when a particular current byte immediately follows a particular prior byte includes an escape code having a length dependent on the frequency with which a code word can not be obtained from the code word supply means when a particular current byte immediately follows a particular prior byte.

3. The method of claim 2 wherein communicated compression code words can be decompressed using a byte supply means that is responsive to the compression code words, such that given identification of the prior byte, and identification of the compression code word length and the start-step-stop code used to create the compression code word, the current byte can be decompressed.

4. The method of claim 3 wherein the byte supply means includes a fixed, look-up table prepared with occurrence frequency information concerning the appearance of current bytes immediately following prior bytes that is substantially the same as the occurrence frequency information concerning the appearance of current bytes immediately following prior bytes used for creating the compression code words.

5. The method of claim 4 wherein the method in used in an interactive informational and transactional network, including at least a host and a plurality of reception systems; wherein compression of the data streams is undertaken at the host and communicated to the reception systems where the compressed code words are reconstituted as an uncompressed byte streams.

6. The method of claim 5 where a first table of predetermined size optimized for compression speed is used to compress data at the host, and a second table of predetermined size smaller than the size of the first table optimized for accommodation by the reception system is used to reconstitute the compressed data.

7. The method of claim 6 wherein the byte stream is pre-compressed before the current byte is sought to be compressed with a compression code word obtained from the fixed table of the code word supply means.

8. The method of claim 7 wherein the byte steam is pre-compressed using run length encoding.

9. The method of claim 8 wherein the interactive service includes data for supporting interactive sessions and data for supporting messages and wherein the data for supporting the interactive sessions and the data for supporting messages are compressed.

* * * * *